(12) United States Patent
Murase et al.

(10) Patent No.: US 8,283,596 B2
(45) Date of Patent: Oct. 9, 2012

(54) LASER PROCESSING APPARATUS AND LASER PROCESSING METHOD, DEBRIS COLLECTION MECHANISM AND DEBRIS COLLECTION METHOD, AND METHOD FOR PRODUCING DISPLAY PANEL

(75) Inventors: Hidehisa Murase, Kanagawa (JP); Yoshinari Sasaki, Tokyo (JP); Kosei Aso, Kanagawa (JP); Naoki Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 929 days.

(21) Appl. No.: 12/138,050

(22) Filed: Jun. 12, 2008

(65) Prior Publication Data

US 2009/0068598 A1    Mar. 12, 2009

(30) Foreign Application Priority Data

Jun. 27, 2007    (JP) ................................. 2007-169381

(51) Int. Cl.
*B23K 26/00*    (2006.01)
*B29C 35/08*    (2006.01)

(52) U.S. Cl. .......... 219/121.84; 219/121.67; 219/121.68; 219/121.7; 219/121.72; 264/400; 264/430

(58) Field of Classification Search ............ 219/121.67–121.72, 121.84; 264/400, 430
See application file for complete search history.

(56) References Cited

U.S. PATENT DOCUMENTS 6,880,646 B2 * 4/2005 Batarseh ........................ 175/15
7,863,542 B2 * 1/2011 Murase et al. ........... 219/121.68
2004/0226927 A1 * 11/2004 Morikazu et al. ........ 219/121.84

FOREIGN PATENT DOCUMENTS

| JP | 04-258394 | 9/1992 |
|----|-----------|--------|
| JP | 05-228681 | 9/1993 |
| JP | 06-246465 | 9/1994 |
| JP | 09-099978 | 4/1997 |
| JP | 09-192870 | 7/1997 |
| JP | 2004-153171 | 5/2004 |
| JP | 2004-337947 | 12/2004 |
| JP | 2007-007724 | 1/2007 |
| WO | WO 2005118210 A1 * | 12/2005 |

* cited by examiner

*Primary Examiner* — Tu B Hoang
*Assistant Examiner* — Brett Spurlock
(74) *Attorney, Agent, or Firm* — SNR Denton US LLP

(57) ABSTRACT

A laser processing apparatus is provided for patterning with laser light a resin film or a metal film formed on a substrate. The apparatus includes a laser light source; and a debris collection device having a transmission window through which the laser light is transmitted, a vortex generation mechanism generating a vortex gas flow by allowing gas to flow into a region near a laser light-irradiated area of the resin film or the metal film, and a screening device having an opening through which the incident laser light passes and screening a flow of debris. The mechanism is placed close to the resin film or the metal film on the substrate. Debris generated by laser light irradiation and before and after being stacked on the object film is entrained in the vortex gas flow generated by the vortex generation mechanism and is exhausted to outside through the screening device.

14 Claims, 16 Drawing Sheets

LASER PROCESSING APPARATUS AND LASER PROCESSING METHOD, DEBRIS COLLECTION MECHANISM AND DEBRIS COLLECTION METHOD, AND METHOD FOR PRODUCING DISPLAY PANEL

CROSS REFERENCES TO RELATED APPLICATIONS

The present invention contains subject matter related to Japanese Patent Application JP 2007-169381 filed in the Japanese Patent Office on Jun. 27, 2007, the entire contents of which are incorporated herein by reference.

BACKGROUND OF THE INVENTION

1. Field of the Invention

The present invention relates to a technology of patterning a resin film or metal film on a multilayer thin film of a flat panel display (FPD) or the like. More particularly, the present invention relates to a laser processing apparatus and a laser processing method, and a debris collection mechanism and a debris collection method, which are intended to remove and collect debris generated during laser processing by ablation, thermofusion or their mixed action by irradiating a surface of an object with laser light, and to a method for producing a display panel.

2. Description of the Related Art

In a process for producing a flat panel display such as a liquid crystal panel, many thin films such as resin films or metal films are superposed on a glass substrate to form a TFT (thin film transistor) substrate, a CF (color filter) substrate or the like. Many photolithography processes are used for patterning and etching such a multilayer substrate.

In a photolithography process, a resin film or metal film is vacuum deposited on a substrate such as a glass, plastic or silicon wafer substrate; a resist layer is formed on the film; and the resist layer is exposed by irradiation with light through a photomask having a predetermined pattern. Then, the photomask pattern is transferred to the resist layer by development and post-baking; areas not covered with the resist in the resin film or metal film are removed by wet etching; and finally the remaining resist layer is removed to obtain a desired pattern of the resin film or metal film.

However, the photolithography process needs a large apparatus such as a coater/developer and is therefore disadvantageous in terms of equipment investment and footprint. The process is also disadvantageous in terms of environmental protection, because a large amount of a chemical such as a developer is used. In this situation, Japanese Unexamined Patent Application Publication No. 2004-153171 proposes a technology of directly processing a thin film such as a resin film or metal film using laser light for omitting the photolithography process and simplifying the production process, for example.

In performing laser processing, it may be generally necessary to collect a substance called debris. Debris is a product from a material by absorption and reaction of laser light or fine particles (waste) from a material. They float and diffuse in the air and are reattached to a substrate. In particular, the reaction product attached to the substrate is solidified due to deprivation of heat and may not even be removed by physical washing using a brush or the like. Therefore, desired processing quality and processing accuracy may not be obtained and product failure occurs. In the field of fine process for a flat panel display such as a liquid crystal panel, such a reattached substance is particles (waste) causing 100% failure. Therefore, a technology of collecting debris may be necessary.

For example, Japanese Unexamined Patent Application Publication No. 10-99978 proposes a debris collection method including providing a fluid delivery apparatus ejecting gas to a surface near a processed region and a fluid suction duct opposite to the fluid delivery apparatus to blow debris off the processed region and suck and remove the debris at the same time (Method 1).

As known, it is effective to blow assist gas to an object while irradiating the object with laser light in order to reduce an amount of debris generated. For example, Japanese Unexamined Patent Application Publication No. 9-192870 proposes a method including providing an internal nozzle on a laser processing head and an external nozzle surrounding a periphery of the internal nozzle to eject assist gas to a processed region from the internal nozzle and suck the ejected assist gas using the external nozzle to exhaust debris (Method 2).

Known methods for controlling generation of debris itself include a method including preventing decomposition or reattachment of debris using predetermined atmospheric gas; and a method including processing an object under reduced pressure having a degree of vacuum of about 10 Pa ($10^{-2}$ Torr), where it is possible to considerably reduce an amount of debris attached to and accumulated on the object.

Further, for example, Japanese Unexamined Patent Application Publication No. 2004-337947 proposes a laser processing method including providing a laser processing head outputting laser light to an object; and a nozzle mounted on a side of the laser processing head facing the object to irradiate the object with the laser light output from the laser processing head through the nozzle and allow the nozzle to suck debris generated near the object together with assist gas while spirally rotating the debris (Method 3).

SUMMARY OF THE INVENTION

However, in Method 1, not all debris may be blown off a surface near a processed region, sucked and exhausted, and the remaining debris is virtually spread along a flow. It is difficult to remove and collect debris even if a sucking force is increased. In method 2 where assist gas is blown to a processed region from an internal nozzle, debris is diffused and reattached and may not be sufficiently removed even if a sucking force of an external nozzle is increased. Further, in Method 3 where debris is sucked while circularly rotating an atmospheric fluid, not all debris diffused in every direction may be collected.

A multilayer film substrate used in a flat panel display has an etching mechanism of a surface film irradiated with laser light and an etching mechanism in a film lower than the surface film which are complicated. When a plurality of process factors are mixed in this manner, debris may not be simply collected and it may be necessary to analyze a debris generation mechanism in detail and develop debris collection methods suitable for the respective films.

An ITO (Indium Tin Oxides) film, a ZnO (zinc oxide) film or the like is typically used as a transparent conductive film used for a transparent electrode on a multilayer film. FIGS. 1A to 1C show as an example a process of etching reaction in a multilayer film formed by depositing a transparent conductive film 103 such as an ITO film or ZnO film on a resin film 102 deposited on a substrate 101 formed of glass, plastic, silicon wafer or the like. A void arrow indicates a magnitude of energy of laser light 104 and a normal arrow indicates a heat diffusion direction.

First, when the surface transparent conductive film 103 is irradiated with the laser light 104, the transparent conductive film 103 absorbs the laser light 104 to generate heated zone 105 (FIG. 1A). As absorption of the laser light 104 by the transparent conductive film 103 proceeds, heated zone 106 is diffused to the lower resin film 102, causing expansion of the resin film to generate microcracks (FIG. 12B). Generally, a ceramic resin film such as an ITO film has an expansion coefficient larger than that of a transparent conductive film by one digit. As diffusion of heated zone 107 to the resin layer 102 as a ground of the transparent conductive film 103 proceeds, the resin layer 102 is vaporized and the cracked transparent conductive film 103 is blown off by volume expansion of the atmosphere resulting from vaporization of the resin layer 102. When the transparent conductive film 103 on the resin film 102 is irradiated with the laser light 104 as described above, debris 108 is generated largely due to heat reaction in addition to common ablation reaction by laser light irradiation. The debris 108 is generated largely due to mechanical breakage and formed of relatively large particles. Therefore, the debris 108 has a diffusion rate or diffusion range smaller than those of a resin film and a metal film described later.

On the other hand, main reaction of an etching mechanism in a resin film (polymer material) on a multilayer film is ablation reaction where the resin layer absorbs laser light to cleave intermolecular bonds. FIGS. 2A to 2C show as an example a process of etching reaction in a multilayer film formed by depositing a resin film 110 on a resin film 102 deposited on a substrate 101.

First, when the surface resin film 110 is irradiated with laser light 104, the resin film 110 absorbs the laser light 104 to generate heated zone 111 (FIG. 2A). When the resin film 110 further absorbs the laser light 104 to cause ablation reaction, debris generated by the ablation reaction is diffused as plume 113 (FIG. 2B). The debris rises (is diffused) while forming large plume 114 at a rate of several ten m/sec according to the law of $\cos\rho$ (FIG. 2C). In the reaction dominated by ablation, a ground of the resin layer 110 is almost not affected by heat. Therefore, in order to collect the debris, it may be necessary to collect the plume rising at a rate of several ten m/sec according to the law of $\cos\rho$.

A metal film on a multilayer film absorbs laser light to generate heat, and etching of the metal film proceeds by melting and evaporation. FIGS. 3A to 3C show as an example a process of etching reaction in a multilayer film formed by depositing a metal film 120 on a resin film 102 deposited on a substrate 101.

First, when the surface metal film 120 is irradiated with laser light 104, the metal film 120 absorbs the laser light 104 to generate heated zone 121 (FIG. 3A). When the metal film 120 further absorbs the laser light 104 and conversion of the heated zone 121 into heated zone 122 proceeds, the metal film 120 is vaporized into debris. The debris forms plume 123 and is evaporated (FIG. 3B). The debris rises (is diffused) while forming large plume 125 at a rate of several ten m/sec according to the law of $\cos\rho$ (FIG. 3C).

Here, the resin film 102 and the metal film 120 are reacted with heat when affected by heat too much. A melting temperature of the metal film is higher than that of the resin film. Therefore, when the resin layer is a lower layer, the resin film is molten and vaporized by an influence of heat; this affects etching of the metal film. For example, the resin film lower than the metal film protrudes or breaks through the metal thin film. Accordingly, in order to etch only the metal film without affecting the lower resin layer, it may be necessary to develop a mechanism of reducing a temperature for melting and evaporation of the metal film and collecting the evaporated molecules.

It is desirable to efficiently remove debris generated during laser processing and reduce debris attached to an object.

According to an embodiment of the present invention, there is provided a debris collection device for patterning using laser light a resin film or a metal film formed on a substrate. The debris collection device includes a transmission window through which the incident laser light is transmitted; a vortex generation mechanism generating a vortex gas flow by allowing gas to flow into a region near a laser light irradiation area of the resin film or the metal film; and a screening device having an opening through which the incident laser light passes and screening a flow of debris. First, the vortex generation mechanism of the debris collection device is placed close to the resin film or the metal film on the substrate. Then, debris generated by laser light irradiation and before and after being stacked on the object film is entrained in the vortex gas flow generated by the vortex generation mechanism and is exhausted to outside through the screening device.

In the above configuration, debris generated by laser light irradiation is entrained and collected in a vortex gas flow together with gas near a laser light irradiation area. Accordingly, the debris is assembled near a center of the laser light irradiation area by the vortex gas flow and the debris may be efficiently collected while suppressing scattering of the debris to a periphery. Further, the screening device screens a flow of the debris around the opening to reduce an amount of the debris passing through the opening.

Further, in the above embodiment, the debris collection device has: a vortex gas flow exhaust part having a transmission hole that is a laser light path and is a vortex gas flow path communicating with an exhaust hole; and a vortex forming part placed facing the substrate. The vortex forming part has a vortex forming plate having a radial vortex forming groove corresponding to a rotation direction of the vortex gas flow and communicating with the transmission hole, the vortex forming groove formed on a surface of the vortex forming part facing the substrate. Gas is introduced into the vortex forming groove of the groove forming plate so that the gas flowing in the vortex forming groove to form the vortex gas flow is exhausted to outside from the exhaust hole through the transmission hole of the vortex gas flow exhaust part.

In the above configuration, a radial vortex forming groove corresponding to a rotation direction of the vortex gas flow and communicating with the transmission hole is formed on a surface of the vortex forming part facing the substrate. Accordingly, gas introduced into the vortex forming part flows along the vortex forming groove and accordingly the vortex gas flow is generated. Debris is entrained in the vortex gas flow and exhausted upward through the transmission hole, so that the debris is assembled near the center of the laser light irradiation area and the debris may be efficiently collected while suppressing scattering of the debris to a periphery.

According to another embodiment of the present invention, there is provided a method for producing a display panel having a substrate formed with a number of wiring patterns corresponding to pixels. The method includes the steps of: depositing a resin film or a metal film on a resin film formed on the substrate; and patterning the resin film or the metal film by irradiation with laser light. The step of patterning the resin film or the metal film using the laser light includes the steps of: bringing a debris collection device closer to the substrate; entraining debris generated by laser light irradiation and before and after being stacked on the object film in the vortex gas flow generated by the vortex generation mechanism; and exhausting the debris to outside through the screening device. The debris collection device has: a transmission window through which the laser light is transmitted; a vortex generation mechanism generating a vortex gas flow by allowing gas to flow into a region near a laser light irradiation area of the resin film or the metal film; and a screening device having an opening through which the incident laser light passes and screening a flow of debris.

In the above configuration, debris generated when irradiating a resin film or metal film on a substrate of a display panel with laser light is entrained and collected in a vortex gas flow together with gas near a laser light irradiation area. Accordingly, the debris is assembled near a center of the laser light irradiation area by the vortex gas flow and the debris may be efficiently collected while suppressing scattering of the debris to a periphery. Further, the screening device screens a flow of the debris around the opening to reduce an amount of the debris passing through the opening.

According to a debris collection mechanism and a debris collection method according to an embodiment of the present invention, it is possible to efficiently collect debris generated during patterning a resin film or metal film on an object.

Therefore, according to a laser processing apparatus and a laser processing method employing the debris collection mechanism and the debris collection method, debris generated from an object during laser light irradiation is efficiently removed, so that the debris attached to the object may be reduced and accuracy and quality in patterning of a pixel electrode or the like is improved. Accordingly, a high quality display panel may be provided.

BRIEF DESCRIPTION OF THE DRAWINGS

FIG. 12A is a top view and FIG. 12B is an X-X cross-sectional view.

DESCRIPTION OF THE PREFERRED EMBODIMENTS

The present invention provides a laser processing apparatus and a laser processing method and a debris collection mechanism and a debris collection method, which remove and collect debris generated during laser processing by ablation, thermofusion or their mixed action by irradiating with laser light a resin film or metal film (object film) on a multilayer thin film formed on a glass substrate that is an object. In the following description, debris generated during laser processing and before and after being stacked is generally called debris.

A laser processing apparatus used in an embodiment of the present invention has a laser light source and an optical system optically projecting laser light emitted from the laser light source to a surface of an object with a predetermined pattern, and includes a debris collection mechanism having an opened exhaust hole that is a local exhaust device.

The debris collection mechanism is placed extremely close to a resin film or metal film as an object film and an atmosphere near a laser light irradiation surface is exhausted from the exhaust hole of the debris collection mechanism, so that the film may be irradiated with laser light in an atmosphere under reduced pressure.

In such a simple configuration, the laser light irradiation surface of the resin film or metal film is in an atmosphere under reduced pressure. Therefore, a sublimation pressure is reduced when the resin film or metal film is detached from a layer lower than the film during laser light irradiation, and it is possible to reduce irradiation energy that may be necessary for processing. Further, gas containing debris detached by laser light irradiation and ejected on a surface near a processed region may be efficiently removed through the exhaust hole of the debris collection mechanism.

A laser processing apparatus and a debris collection mechanism according to an embodiment of the present invention will be described below with reference to FIGS. 4 to 12.

Figure 1A:
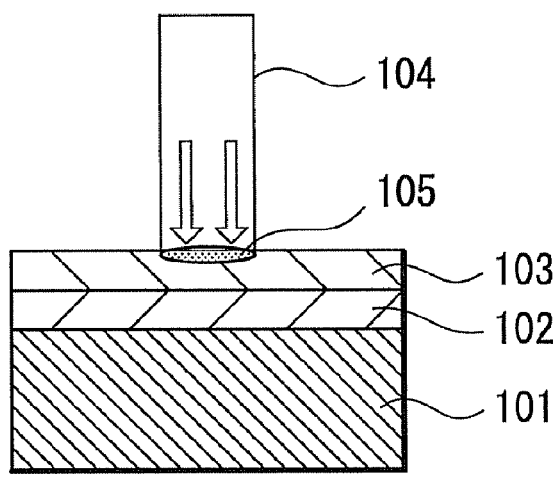
FIGS. 1A, 1B and 1C are views for describing etching reaction in a transparent conductive film on a multilayer film.
Figure 1B:
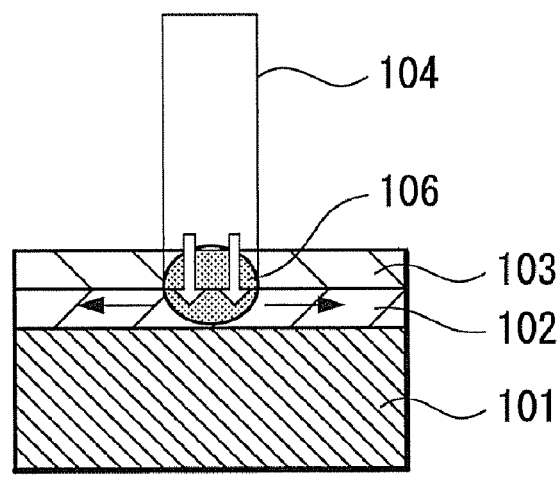
Figure 1C:
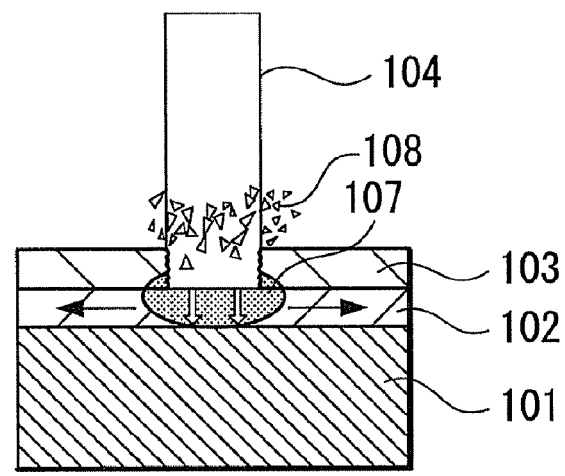
Figure 2A:
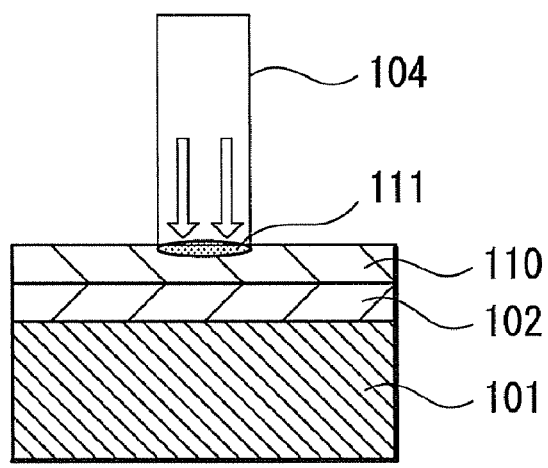
FIGS. 2A, 2B and 2C are views for describing etching reaction in a resin film on a multilayer film.
Figure 2B:
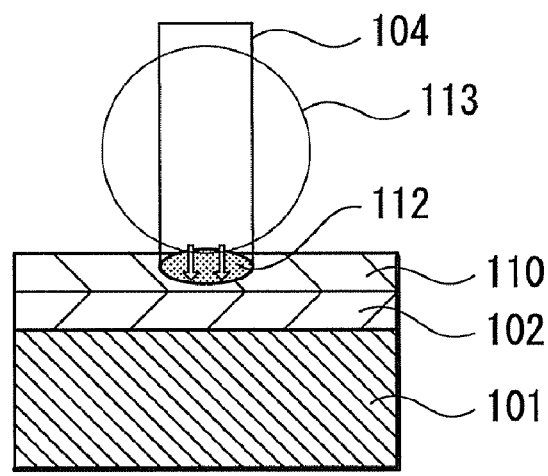
Figure 2C:
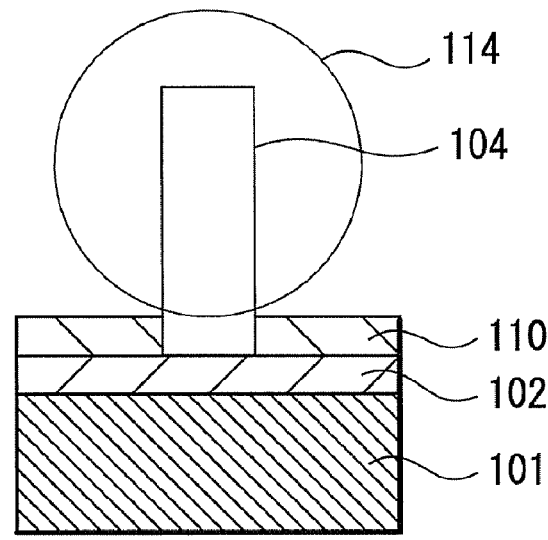
Figure 3A:
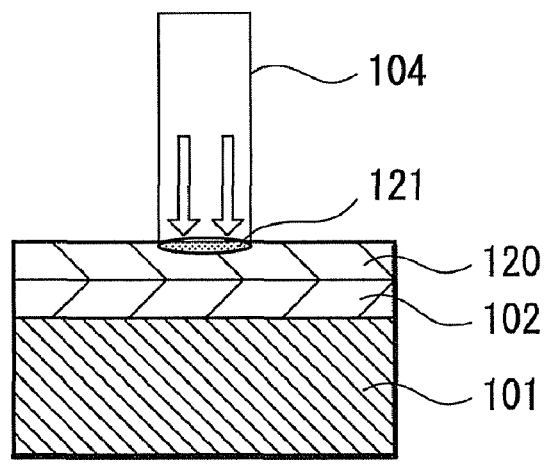
FIGS. 3A, 3B and 3C are views for describing etching reaction in a metal film on a multilayer film.
Figure 3B:
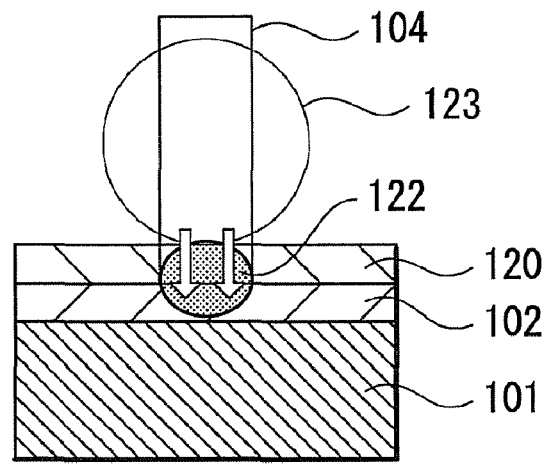
Figure 3C:
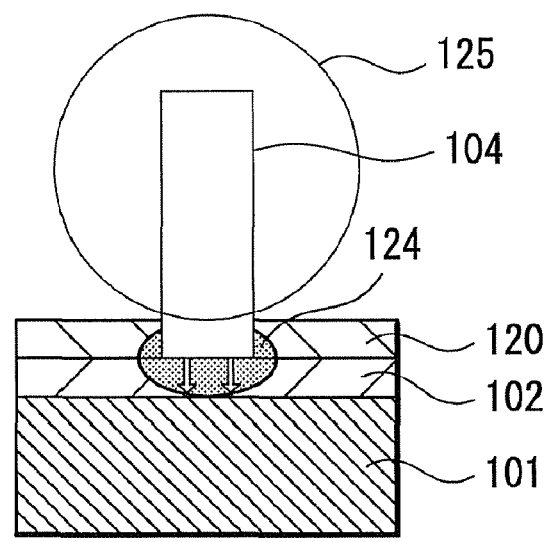
Figure 4:
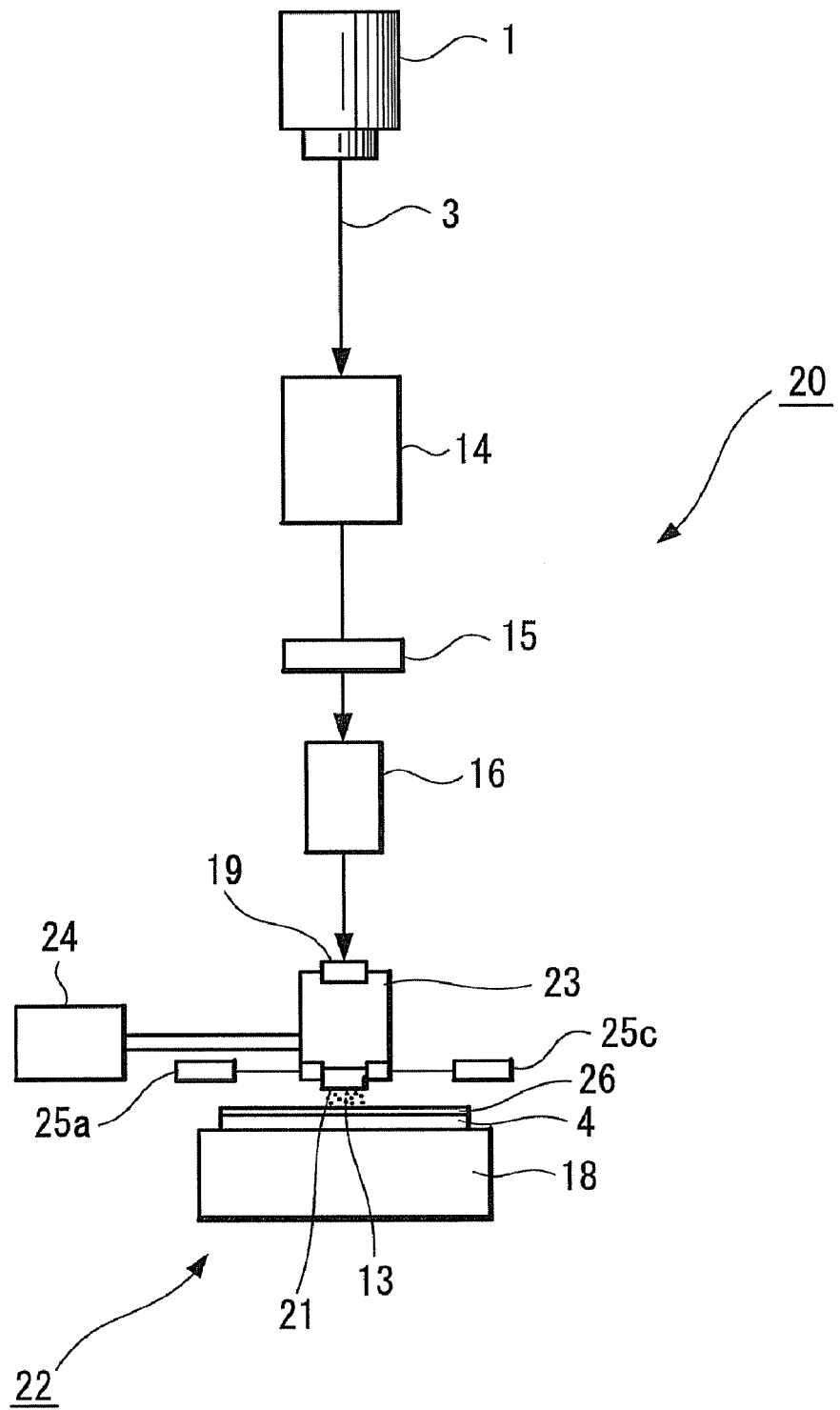
FIG. 4 is a whole configuration view of a laser processing apparatus according to an embodiment of the present invention.
Figure 5:
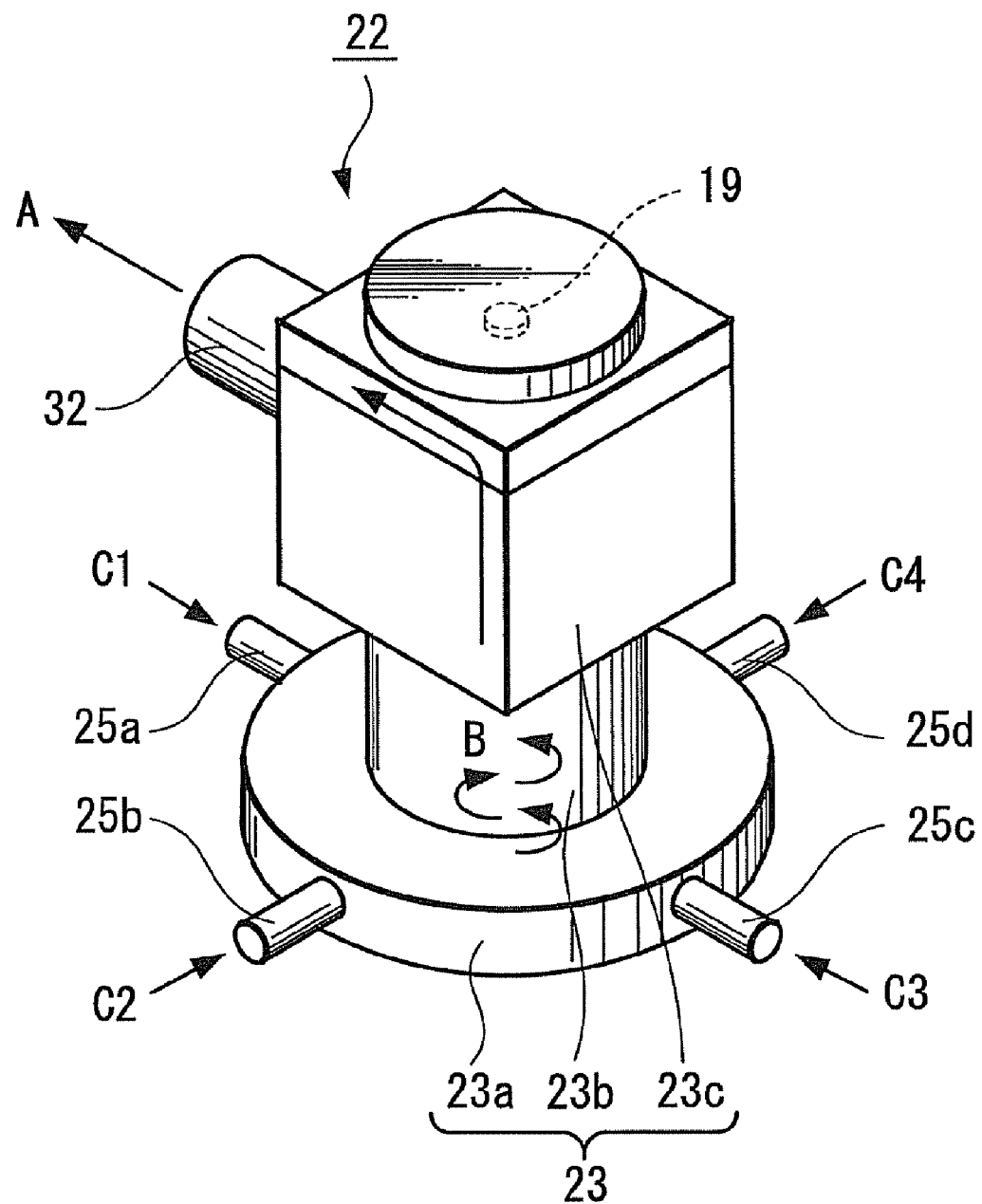
FIG. 5 is a perspective view of a debris collection mechanism used in a laser processing apparatus according to an embodiment of the present invention.
Figure 6:
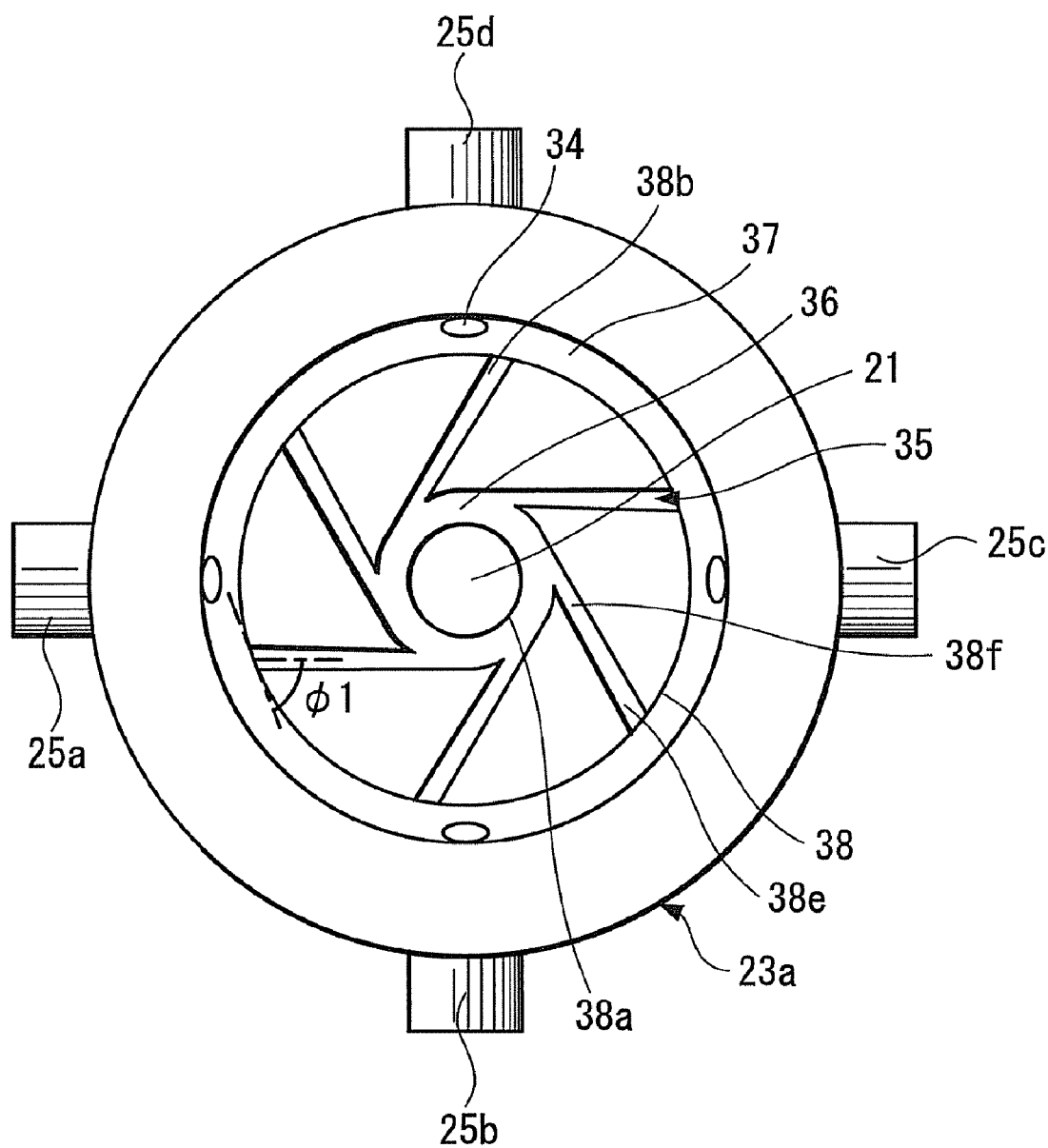
FIG. 6 is a bottom view of a base part of a debris collection mechanism used in a laser processing apparatus according to an embodiment of the present invention.
Figure 7:
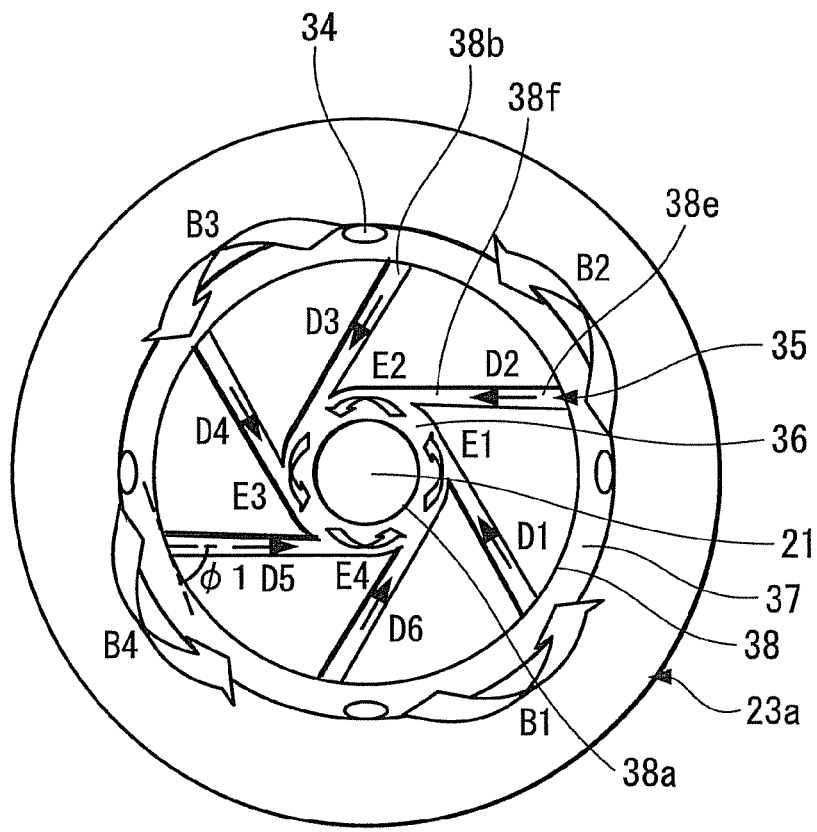
FIG. 7 is a bottom view of a base part of a debris collection mechanism used in a laser processing apparatus according to an embodiment of the present invention for describing a vortex generation method.
Figure 8:
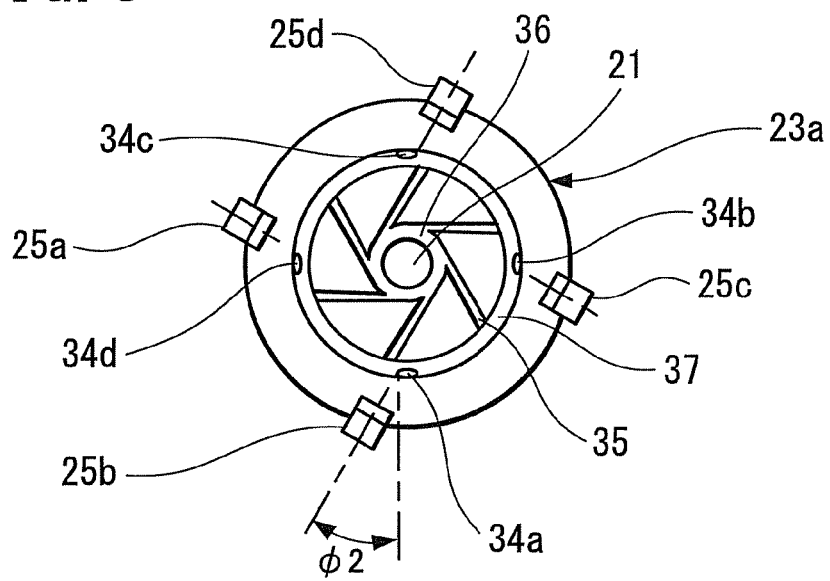
FIG. 8 is a plan view for describing a method of generating a concentric gas flow by a concentric groove in a debris collection mechanism used in a laser processing apparatus according to an embodiment of the present invention.
Figure 9:
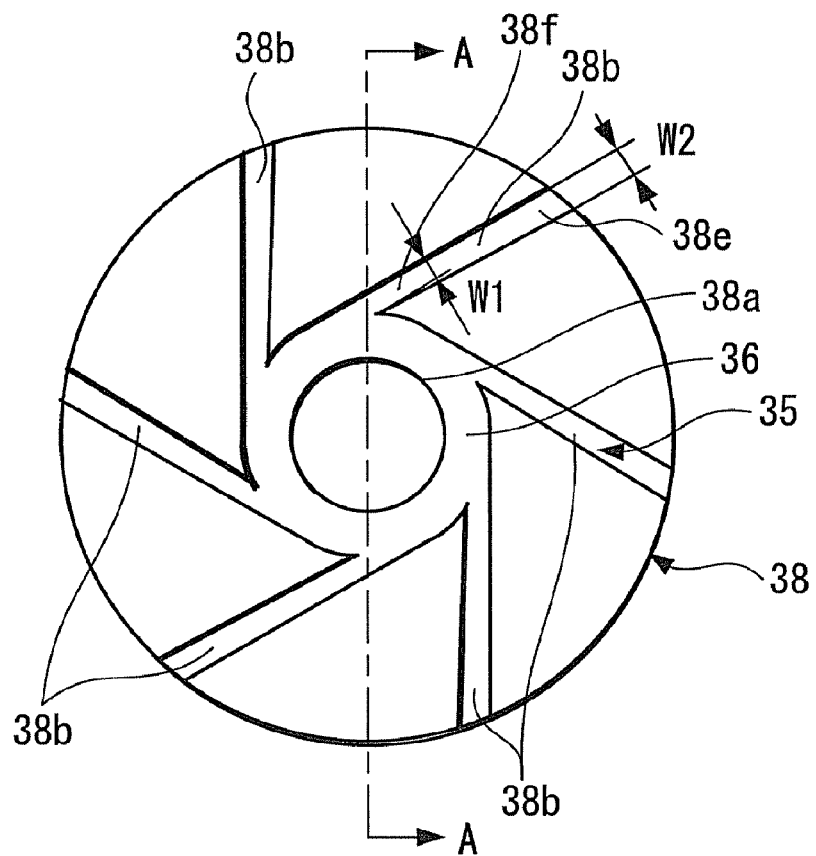
FIG. 9 is a plan view of a vortex forming plate in a debris collection mechanism used in a laser processing apparatus according to an embodiment of the present invention.
Figure 10:
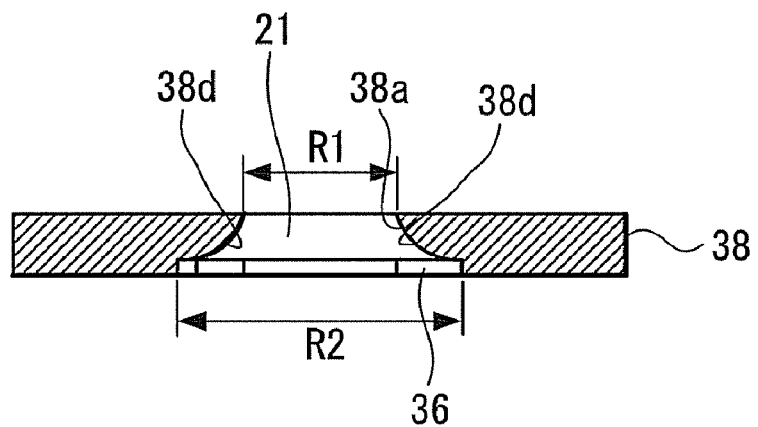
FIG. 10 is an A-A cross-sectional arrow view of FIG. 9.
Figure 11:
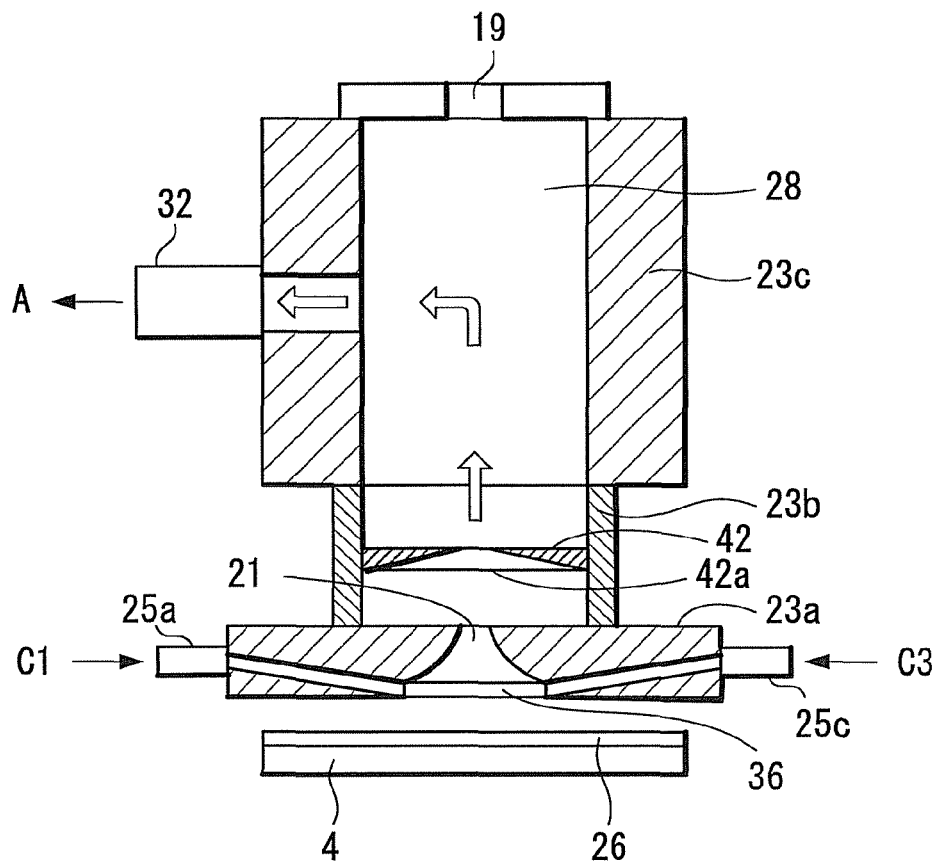
FIG. 11 is a schematic cross-sectional view of a debris collection mechanism used in a laser processing apparatus according to an embodiment of the present invention.
Figure 12A:
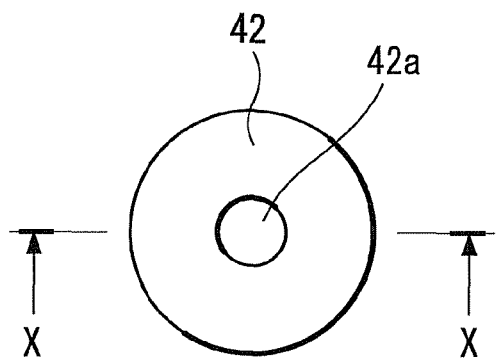
FIGS. 12A and 12b show an example of a screening plate used in a laser processing apparatus according to an embodiment of the present invention, where
Figure 12B:
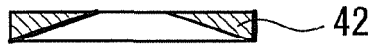

FIG. 4 is a whole configuration view showing an example of a laser processing apparatus according to an embodiment of the present invention. FIG. 5 is a perspective view of a debris collection mechanism used in a laser processing apparatus according to an embodiment of the present invention. FIG. 6 is a bottom view of a base part of a debris collection mechanism used in a laser processing apparatus according to an embodiment of the present invention. FIG. 7 is a bottom view of a base part of a debris collection mechanism used in a laser processing apparatus according to an embodiment of the present invention for describing a vortex generation method. FIG. 8 is a plan view for describing a method of generating a concentric gas flow by a concentric groove in a debris collection mechanism used in a laser processing apparatus according to an embodiment of the present invention. FIG. 9 is a plan view of a vortex forming plate in a debris collection mechanism used in a laser processing apparatus according to an embodiment of the present invention. FIG. 10 is an A-A cross-sectional arrow view of FIG. 9. FIG. 11 is a schematic cross-sectional view of a debris collection mechanism used in a laser processing apparatus according to an embodiment of the present invention. FIGS. 12A and 12B show an example of a screening plate used in a laser processing apparatus according to an embodiment of the present invention, where FIG. 12A is a top view and FIG. 12B is an X-X cross-sectional view.

Figure 13:
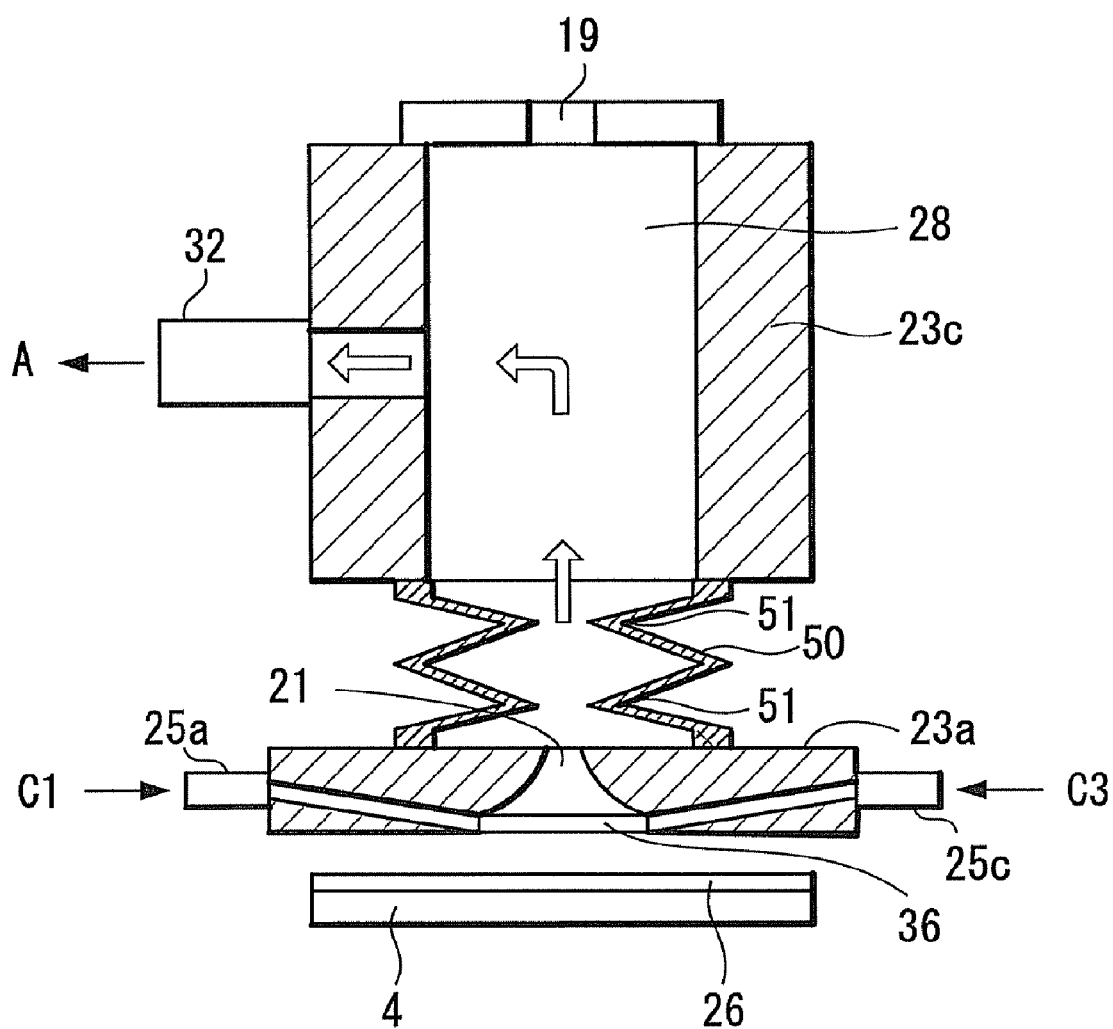
FIG. 13 is a schematic cross-sectional view of a debris collection mechanism used in a laser processing apparatus according to another embodiment of the present invention.
Figure 14:
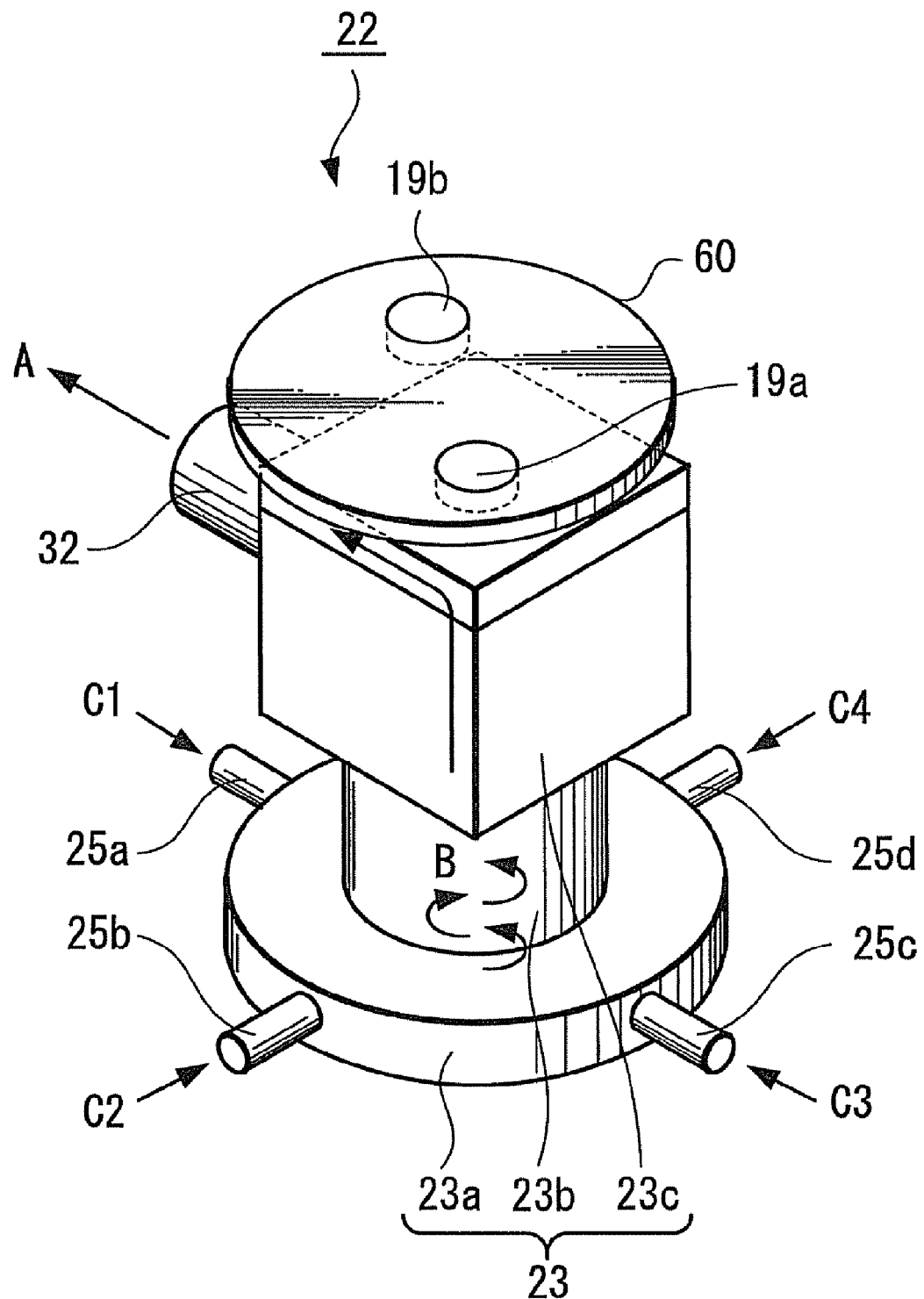
FIG. 14 is a perspective view of a debris collection mechanism used in a laser processing apparatus according to another embodiment of the present invention.

FIG. 13 is a schematic cross-sectional view of a debris collection mechanism used in a laser processing apparatus according to another embodiment of the present invention. FIG. 14 is a perspective view of a debris collection mechanism used in a laser processing apparatus according to another embodiment of the present invention.

In FIG. 4, the laser processing apparatus 20 includes: a laser control unit 1 having a laser light source; a beam shaper 14; a mask or variable aperture 15; a projection lens 16; a stage 18; a debris collection device 22; an exhaust pump (roughing pump) 24; and a gas flow introduction device.

An excimer laser is used as the laser light source of the laser control unit 1, for example. There are a plurality of excimer lasers with different laser media which are XeF (351 nm), XeCl (308 nm), KrF (248 nm), ArF (193 nm) and F2 (157 nm) in descending order of wavelength. However, the laser is not limited to an excimer laser and may be a solid laser, a $CO_2$ laser or the like.

The beam shaper 14 shapes laser light 3 from the laser light source and makes a beam intensity uniform to output the laser light 3. The mask or variable aperture 15 has a predetermined pattern shape and allows the laser light 3 shaped by the beam shaper 14 to pass therethrough to process the laser light 3 into a beam with a predetermined pattern. Examples of the mask or variable aperture 15 used include a perforated mask formed of a metal material; a photomask formed of a transparent glass material or a metal thin film; and a dielectric mask formed of a dielectric material. The projection lens 16 reduces the laser light 3 having passed through the pattern of the mask or variable aperture 15 at a predetermined magnification and projects the laser light 3 to a surface of a substrate that is an object on the stage 18.

The stage 18 is placed so that the laser light 3 projected from the projection lens 16 is focused on the surface of the substrate 4. The stage 18 is formed of an X-Y stage, a three-axis stage or the like that may be moved and positioned along a plane perpendicular to an optical axis of the laser light 3, where the surface of the substrate 4 as an object may be scanned with the laser light 3. The stage 18 has a fixing device such as a vacuum chuck for fixing an object, and may be moved and positioned in x, y, z and θ directions so that a desired position on an object film 26 of the object may be irradiated with the laser light 3 and the laser light 3 may be focused on the object film 26.

In the laser processing apparatus 20, the laser light 3 emitted from the laser light source of the laser control unit 1 is shaped into a predetermined shape and dimension and then patterned into a predetermined patterning shape by the mask or variable aperture 15. The laser light 3 having the predetermined patterning shape is transmitted through the projection lens 16 and is applied to the object film 26 on the substrate 4 through an upper transmission window 19 and a transmission hole 21 of the debris collection device 22.

The laser light 3 is applied to the object film 26 formed on the surface of the substrate 4 through the upper transmission window 19 formed in an upper part of an enclosure 23 of the debris collection device 22 and the transmission hole 21 formed in a bottom part of the enclosure 23. An exhaust pump 24 and four pipes (gas introduction parts 25a to 25d) forming the gas flow introduction device are provided protruding from the enclosure 23 of the debris collection device 22.

In the present embodiment, the object film 26 is a thin film such as a resin film 110 or a metal film 120 shown in FIGS. 2A to 2C or 3A to 3C. However, a multilayer film including the resin film 110 may be at least a film where a resin film 102 is deposited below the resin film 110, and is not limited to the example shown in FIGS. 2A to 2C. A multilayer film including the metal film 120 may be at least a film where the resin film 102 is deposited below the metal film 120, and is not limited to the example shown in FIGS. 3A to 3C.

FIG. 5 shows a perspective view of the debris collection device 22 having a debris collection mechanism. The enclosure 23 of the debris collection device 22 includes an approximately disk-shaped vortex forming base 23a placed facing an object; a cylindrical gas derivation part 23b vertically provided in an approximate center of the vortex forming base 23a; and an approximately cubic chamber 23c placed on the gas derivation part 23b. They are made of aluminum, stainless steel or the like. The vortex forming base 23a functions as a vortex forming part, and the gas derivation part 23b and the chamber 23c function as a vortex gas flow exhaust part.

The upper transmission window 19, through which the laser light 3 is transmitted, is formed of quartz in the case of using a KrF laser and formed of calcium fluoride in the case of using an ArF laser, for example, in an upper part of the chamber 23c. An exhaust hole 32 is made in one side plate of the chamber 23c. An exhaust duct (not shown) is inserted into the exhaust hole 32 to exhaust collected debris 13 in an arrowed A direction using the exhaust pump 24 shown in FIG. 4. A vortex forming mechanism is provided for the gas derivation part 23b and the vortex forming base 23a under the chamber 23c, so that the debris 13 may be assembled and collected spirally as indicated by an arrow B in a center of the vortex forming base 23a. A later-described screening device is provided inside a part connecting the upper and lower parts of the chamber 23c to each other to prevent attachment of debris to the upper transmission window 19.

As shown in FIG. 5, the gas introduction parts 25a, 25b, 25c and 25d are provided in positions dividing a circumference of the vortex forming base 23a into quarters, respectively. Gas is supplied to the gas introduction parts 25a, 25b, 25c and 25d in directions indicated by arrows C1, C2, C3 and C4, respectively, and the gas is introduced into the vortex forming base 23a.

The gas introduced from the gas introduction parts 25a, 25b, 25c and 25d is called assist gas. Examples of the assist gas include CDA (clean dry air); inert gases such as helium and neon; and nitrogen. When assist gas is supplied near a laser light irradiation surface in the vortex forming base 23a in this manner, generation of debris may be suppressed.

FIG. 6 shows a vortex forming mechanism formed on a lower surface of the approximately disk-shaped vortex forming base 23a forming the enclosure 23 of the debris collection device 22. The transmission hole 21, through which the laser light 3 is transmitted, is formed in a center of a disk of the vortex forming base 23a. A vortex forming plate 38 is concentrically placed around the transmission hole 21.

As shown in FIGS. 9 and 10, the vortex forming plate 38 has an internal diameter 38a having a diameter equal to that of the transmission hole 21 and made in a center of an approximate disk formed of a metal such as aluminum. Further, a vortex forming space 36 as an approximately hexagonal groove (or an approximately round groove) is formed surrounding the internal diameter 38a, that is, between the transmission hole 21 and vortex forming grooves 35. The vortex forming space 36 functions as a space to form a vortex gas flow (circular gas flow) as described later with reference to FIG. 7. Gas supplied to the vortex forming space 36 from each of the vortex forming grooves 35 collides with walls of the vortex forming plate 38 (see FIG. 10), and the colliding gas flows along the walls of the vortex forming plate 38 to generate a circular gas flow. The circular gas flow is sucked upward by the exhaust pump 24 shown in FIG. 4 so that a vortex is formed with only a little turbulence.

Six radial grooves 38b each having a groove width W2 (see FIG. 9) from an inner periphery to an outer periphery are formed along respective sides of the hexagonal shape of the vortex forming space 36. The radial grooves 38b function as the vortex forming grooves 35 for assembling the debris 13 generated by irradiation of the laser light 3 in the central internal diameter 38a, respectively.

The vortex forming groove 35 has a predetermined angle φ1 formed with a later-described tangent drawn at a connection point between the concentric groove 37 concentrically provided with the transmission hole 21 and a central axis of the vortex forming groove 35, and communicates with the transmission hole 21 through the vortex forming space 36. A degree of the angle φ1 is determined by a direction of gas flowing in the concentric groove 37 (a rotation direction of the vortex gas flow). For example, when the gas flows counterclockwise in the concentric groove 37 in FIG. 6, the angle φ1 formed by the vortex forming groove 35 and the tangent is placed on a downstream side. Here, the vortex forming groove 35 is formed to make the angle φ1 acute. On the other hand, an angle (180-φ1) formed by the vortex forming groove 35 and the tangent on an upstream side is obtuse.

As shown in FIG. 9, in order to rapidly assemble in the vortex forming space 36 the debris 13 scattering from the processed surface, the radial groove 38b forming the vortex forming groove 35 has the groove width W2 of a supply part 38e supplying gas on the outer periphery of the disk larger than a groove width W1 of an exhaust part 38f exhausting gas on the vortex forming space 36 to have a predetermined opening ratio. For example, it is preferable to select an opening ratio of the groove width W1 near the exhaust part 38f to the groove width W2 near the supply part 38e (W1:W2) of 1:1.5 to 2.5.

An appropriate opening ratio is provided for the discharge part and the supply part of the vortex forming groove 35 provided in the vortex forming plate 38, making it possible to increase a flow rate of gas flowing into the vortex forming space 36 and entrain the debris 13 in the vortex easily when rectified gas is introduced into the vortex forming plate 38 from the concentric groove 37.

Further, in order to efficiently collect the debris 13 assembled in the vortex forming space 36 in a center of the vortex forming plate 38, an R shape (curve) or tapered shape 38d as shown in FIG. 10 is formed in the internal diameter 38a near an opening of the transmission hole 21, specifically, on a wall where the transmission hole 21 is connected to the vortex forming space 36. In such a configuration, air resistance in the opening of the vortex forming plate 38 is reduced and therefore the debris may be smoothly exhausted.

A vortex is not formed when the vortex forming space 36 provided on the inner periphery of the vortex forming plate 38 is too large. In order to generate a vortex gas flow with only a little turbulence, that is, an appropriate circular gas flow in the vortex forming space 36, a diameter R2 of the vortex forming space 36 is found to be suitably at least about 1.5 times or less a diameter R1 of the transmission hole 21. The vortex forming space 36 is concentrically attached to the transmission hole 21 of the vortex forming base 23a through screw holes (not shown) made near outer peripheries of convex parts remaining as approximate triangles in the vortex forming plate 38, for example. Obviously, the vortex forming plate 38 may be formed integrally with the vortex forming base 23a.

As shown in FIG. 6, in order to form a vortex only with a little turbulence, the concentric (circular) groove 37 communicating with the vortex forming grooves 35 is formed around the vortex forming plate 38 fixed to the vortex forming base 23. Four gas supply holes 34 communicating with the gas introduction parts 25a, 25b, 25c and 25d are made in positions dividing the concentric groove 37 in quarters. As described above, the concentric groove 37 concentrically provided with the transmission hole 21 is provided on an outer periphery of the vortex forming plate 38 at a forepart of allowing gas to flow into the vortex forming plate 38 in a bottom part of the vortex forming mechanism. Accordingly, a flow of gas introduced through the gas supply holes 34 is rectified and a gas flow is formed corresponding to a shape (direction) of the vortex forming groove 35. The gas flow is supplied to each of the vortex forming grooves 35, causing a vortex to be formed only with a little turbulence in the vortex forming space 36. In this example, the number of the gas supply holes 34 is four; however, the number is not limited thereto.

As shown in FIG. 8, in order to maximize debris collection ability by forming a vortex with a turbulence as little as possible to assemble the debris 13 in the center, the gas introduction part 25a, 25b, 25c or 25d has a certain angle φ2 (ideally 90°) formed with the gas supply hole 34 supplying gas to the concentric groove 37. Specifically, a central axis of each of the gas introduction parts 25a, 25b, 25c and 25d is placed to have an angle φ2 formed with a straight line connecting a center of the transmission hole 21 to each of the gas supply holes 34a, 34b, 34c and 34d. The angle φ2 corresponds to a direction of each of the vortex forming grooves 35, that is, corresponds to a direction of a gas flow that should be generated in the concentric groove 37.

For example, when a counterclockwise gas flow is generated in the concentric groove 37 in FIG. 8, gas flowing in the concentric groove 37 is taken in the vortex forming grooves 35 more smoothly with smaller resistance. When a counterclockwise gas flow is generated in the concentric groove 37, each of the gas introduction parts 25a, 25b, 25c and 25d is placed as inclined at an angle φ2 on an upstream side. Accordingly, a counterclockwise rectified round flow corresponding to a direction of each of the vortex forming grooves 35 is generated in the concentric groove 37, so that a vortex gas flow may be efficiently formed.

A vortex forming method in the above configuration will be described with reference to FIG. 7. FIG. 7 shows a bottom surface of the same vortex forming base 23a as in FIG. 6. Gas supplied from the four gas supply holes 34 made in the concentric groove 37 formed on the outer periphery of the vortex forming plate 38 generates a counterclockwise circular gas flow as indicated by arrows B1, B2, B3 and B4 along the concentric groove 37. The circular gas flow is exhausted from the supply part 38e to which gas is supplied in the radial grooves 38b formed radially from the transmission hole 21 to the exhaust part 38f on the transmission hole 21 by generating a gas flow indicated by arrows D1, D2, D3, D4, D5 and D6. Accordingly, a counterclockwise round gas flow is generated as indicated by arrows E1, E2, E3 and E4 in a circumferential part of the vortex forming space 36. A rising gas flow is acted on an atmosphere of the round gas flow indicated by the arrows E1, E2, E3 and E4 by the exhaust pump 24. As a result, a coiled or spiral rising gas flow is generated in the gas derivation part 23b and the chamber 23c and gas rising in the transmission hole 21 is exhausted to outside from the exhaust hole 32.

Here, there will be described a method for maintaining the debris collection device 22 at a predetermined distance (within 50 μm, for example) from the object film 26. First, a displacement gauge is previously placed at a position as high as a bottom surface of the debris collection device 22 (a surface facing the object film 26). Then, displacement of a position subsequently irradiated with the laser light 3 is measured while performing irradiation with the laser light 3. Based on the measurement data, a height of the debris collection device 22 is controlled as needed by a driving device such as a motor to perform irradiation of the laser light. Accordingly, a certain narrow interval is maintained between the object film 26 on the substrate 4 and the bottom surface of the debris collection device 22, and an inside of the debris collection device 22 may be under reduced pressure. That is, irregularities on an irradiation surface of an object are absorbed, a distance between the bottom surface of the debris collection device 22 and the object may be constantly maintained, focus control is not necessary, and debris may be easily collected. In particular, when the object film 26 is a metal film, it is important to maintain a region near a laser light irradiation area under reduced pressure in this manner to reduce a vapor pressure of the metal film, since the metal film has a high melting point and is difficult to be evaporated.

Next, a screening device screening a flow of debris will be described.

FIG. 11 is a schematic cross-sectional view of a debris collection mechanism for describing an example of a screening device. In FIG. 11, parts corresponding to those of FIGS. 4 to 10 are indicated by the same symbols. As shown in FIG. 11, a screening plate 42 having an opening 42a is placed inside the part connecting the upper part of the chamber 23c (a transmission hole 28) to the transmission hole 21 on a bottom surface (under the chamber 23c), that is, inside the gas derivation part 23b. The opening 42a is formed in an approximate center of the screening plate 42 and is placed on a laser light path to allow laser light applied to the object film 26 to pass therethrough.

Debris generated by laser light processing rides a vortex gas flow generated by gas introduced into the vortex forming space 36 of the vortex forming base 23a from the gas introduction parts 25a, 25b, 25c and 25d through air holes, and the debris is wound up to the screening plate 42 from the transmission hole 21. Here, the debris is prevented from rising by the screening plate 42 and is attached to a lower surface of the screening plate 42. Gas from which the debris is removed by the screening plate 42 passes through the opening 42a, is wound up to the transmission hole 28 of the vacuum chamber 23c, and is exhausted to outside from the exhaust hole 32.

FIGS. 12A and 12B are views showing an appearance of the screening plate 42, where FIG. 12A is a top view and FIG. 12B is an X-X line cross-sectional view. As shown in FIGS. 12A and 12B, the screening plate 42 is a low bottomed cylinder having an opening or a low column or disk having openings on both bottom surfaces. One side of the screening plate 42 is widely opened and the other side has the opening 42a formed with a predetermined size on a bottom surface to penetrate the screening plate 42. The screening plate 42 of this example is approximately in the shape of a bowl formed between the opening 42a and an opening edge opposite to a bottom surface on which the opening 42 is made.

The opening 42a formed on the bottom surface of the screening plate 42 is preferably as large as or slightly larger than a beam size (diagonal dimension) of the laser light 3 passing through the opening 42a. In this example, the opening 42a is 0.5 mm to 1 mm larger than the beam size, for example. Accordingly, among debris generated in a laser light irradiation area of the object film 26 and rising toward the upper transmission window 19, debris rising around the laser light 3 having such a beam size may be screened and an amount of debris passing through the opening 42a may be minimized.

Further, another example of a screening device will be described.

FIG. 13 is a schematic cross-sectional view of a debris collection mechanism for describing another example of a screening device. In FIG. 13, parts corresponding to those of FIG. 11 are indicated by the same symbols and the description thereof is omitted. The screening device of this example is not a screening plate provided inside a gas derivation part but is a cylinder surface or inner wall of a gas derivation part having an irregular structure. A peripheral wall of a gas derivation part 50 has an irregular structure with varied diameters to form a bellows. As in the aforementioned case, each of small diameter parts 51, 51 of the gas derivation part 50 (bellows) preferably has a diameter as large as or slightly larger than a beam size (diagonal dimension) of the passing laser light. Obviously, the two small diameter parts 51, 51 may have different diameters.

In such a configuration, a screening device may be provided in a debris collection mechanism without adding other components such as the screening plate 42. The irregular bellows structure may provide the same trap function (screening function) as in a case where a plurality of screening plates are provided, and thus improves a trap function for debris. Further, this example has other effects similar to a case where the screening plate 42 is used.

In laser processing, ablation is mainly carried out for etching reaction in a resin film and thermofusion is mainly carried out for etching reaction in a metal film. Here, debris becomes a balloon-like mass called plume and is diffused at an initial rate of several ten m/sec according to the law of cos ρ. Since a direction of a vapor flow having such an initial rate may not be changed by a vortex gas flow flowing into the debris collection device 22, it may be necessary to screen (trap) debris by providing a screening device in order to prevent attachment of the debris to the upper transmission window 19. However, since a path for the laser light 3 may not be blocked, it may be impossible to completely prevent contamination of the upper transmission window 19 even with the screening device. Therefore, in a laser processing apparatus used in an apparatus for mass production of a flat display panel, it may be necessary to provide a mechanism for automatically replacing an upper transmission window through which incident laser light may pass.

There will be described below an embodiment where a transmission window may be replaced.

FIG. 14 is a schematic cross-sectional view of a debris collection mechanism and shows a rotation mechanism for protecting a transmission window. As shown in FIG. 14, parts corresponding to those of FIG. 5 are indicated by the same symbols. This example differs from the example of FIG. 5 in that the debris collection mechanism has a revolver-shaped rotary replacement mechanism having a plurality of transmission windows. A disk-shaped rotary mechanism 60 with an upper transmission window 19a and an upper transmission window 19b is provided on an upper surface of the vacuum chamber 23c. The rotary mechanism 60 is rotatable around a rotation axis parallel to a laser light axis as a rotation center using a driving device such as a motor. The screening plate 42 (not shown) having the opening 42a is placed inside the gas derivation part 23b.

In such a configuration, the upper transmission window 19a is placed in a center on the upper surface of the vacuum chamber 23c. After laser processing performed on a certain number of object substrates using the upper transmission window 19a, the rotary mechanism 60 is rotated at the time of substrate replacement to replace the upper transmission window 19a with the new upper transmission window 19b and continue laser processing. In this case, a synergetic effect of a screening function and a transmission window replacement function is achieved, so that debris may be efficiently collected and laser processing may be performed under an appropriate condition by appropriately replacing a transmission window.

The same effect may be obviously achieved by combining a vacuum chamber having the transmission window replacement mechanism of this example with the aforementioned screening device having a bellows structure (gas derivation part 50). The number of transmission windows is two in the example shown in FIG. 14; however, the number is not limited thereto.

As described above, according to a debris collection mechanism and a debris collection method according to an embodiment of the present invention, it is possible to efficiently collect debris generated during patterning a resin film or metal film formed on an object.

Therefore, according to a laser processing apparatus and a laser processing method employing the debris collection mechanism and the debris collection method, debris generated during laser light irradiation is efficiently removed, so that the debris attached to an object may be reduced. This makes it possible to improve a processed edge shape and eliminate a residue, so that a multilayer film may have a surface with a desired fine structure.

A display panel called a flat panel display such as a liquid crystal display is formed with a wiring substrate including elements such as thin film transistors (TFT) and capacitors; and various conductive members such as a plurality of wirings (signal wirings and potential supply wirings, for example) electrically connected to these elements. An organic EL (electroluminescence) display TFT substrate has a plurality of potential supply wirings in addition to signal wirings and scanning wirings, so that a wiring density in a pixel is increased and a pixel structure is further complicated. Therefore, a patterning technology that may provide a surface with a desired fine structure as in an embodiment of the present invention is highly important for mass production of a wiring substrate forming a display. A product having a high-quality multilayer film such as display panels including a flat display panel may be produced and provided using a laser processing method according to an embodiment of the present invention.

Further, debris may be completely removed by a new process that allows high-quality patterning of a resin film or metal film by laser processing (dry method) and replaces a patterning method performed in a photolithography process in the past (wet method).

Investment, environmental burdens, product cost and footprint are reduced by eliminating the photolithography process.

In the above embodiment, an angle is formed between the concentric groove 37 and a flow of gas supplied from the concentric groove 37 to rectify a flow of gas flowing into the vortex forming plate 38, making it possible to form vortex gas with only a little turbulence.

In the above embodiment, the vortex forming radial groove 38b is provided for the vortex forming plate 38 with a predetermined opening ratio, making it possible to increase a flow rate of gas flowing into the vortex forming space and entrain debris in a vortex easily.

In the above embodiment, the vortex forming plate 38 has the vortex forming space 36 having a diameter 1.5 times or less the diameter of the transmission hole 21, for example, making it possible to form a vortex with only a little turbulence.

In the above embodiment, the internal diameter 38a provided in the vortex forming space 36 has the R shape or tapered shape 38d and debris entrained in a vortex is exhausted from the transmission hole 21 for exhausting, so that the debris may be collected with reduced air resistance to the vortex at the opening of the vortex forming space 36.

In the above embodiment, debris is assembled in the transmission hole 21 in a center of a laser light irradiation area by a vortex gas flow, making it possible to suppress scattering of the debris to a periphery of the laser light irradiation area. Even if the debris remains in the laser light irradiation area, the debris is assembled in the transmission hole 21 in the center of the irradiation area, so that the debris is further irradiated with laser light and may be completely removed.

There will be described below an embodiment of a method for producing a display panel using the aforementioned laser processing apparatus (debris collection mechanism). In the present embodiment, the present invention is applied to a liquid crystal display as a display panel.

Figure 15:
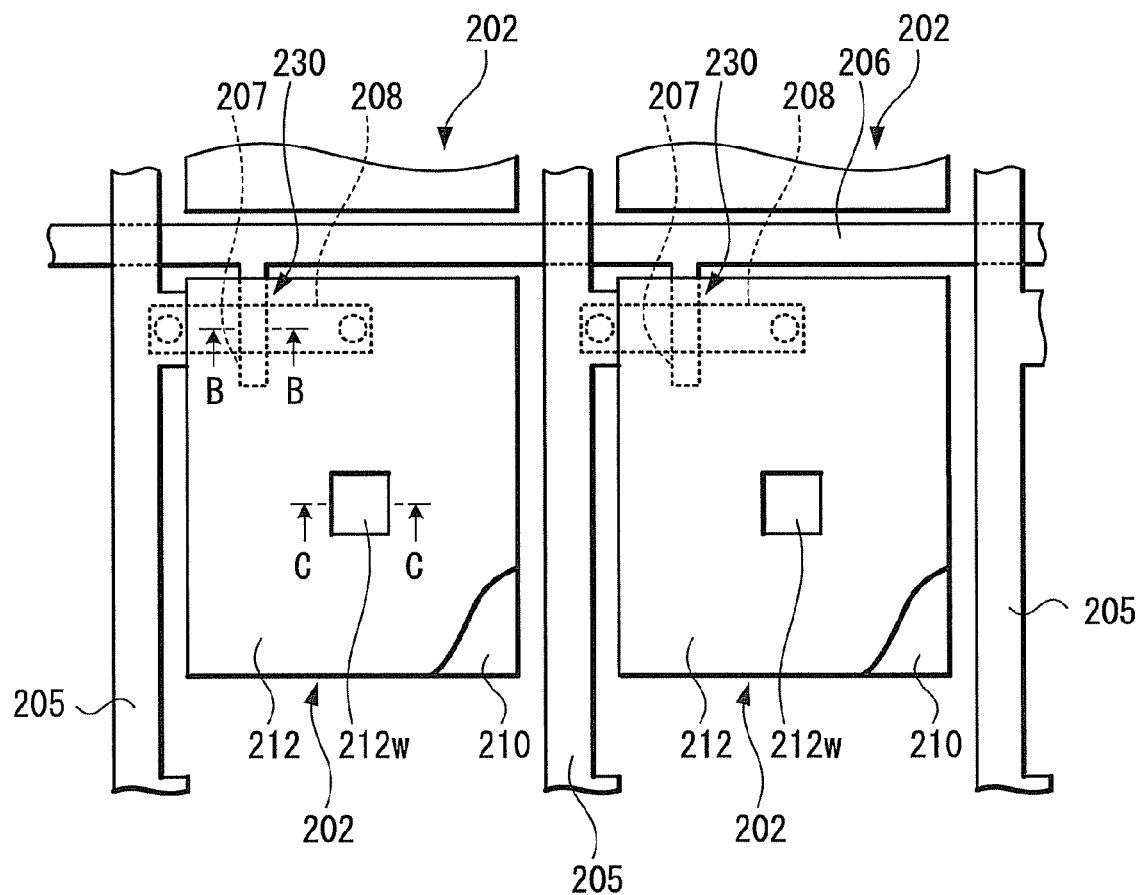
FIG. 15 is a plan view showing an example of a configuration of a driving substrate in a liquid crystal display.

FIG. 15 is a plan view showing an example of a configuration of a driving substrate in a liquid crystal display to which an embodiment of the present invention is applied. As shown in FIG. 15, a driving substrate (wiring substrate) 201 has pixel electrodes 202 arranged in matrix; and TFT elements 230 provided in the pixel electrodes 202, respectively. The pixel electrode 202 is provided for each pixel in the liquid crystal display, and a signal line 205 and a gate line 206 are provided between the pixel electrodes 202.

The pixel electrode 202 has a transmissive pixel electrode 210; and a reflective pixel electrode 212 formed on the transmissive pixel electrode 210. An opening 212w is formed in the reflective pixel electrode 212.

The TFT element 230 has a gate electrode 207; and a polysilicon layer 208 placed intersecting the gate electrode 207. The gate electrode 207 is electrically connected to the gate line 206. The polysilicon layer 208 has one end electrically connected to the signal line 205 and the other end electrically connected to the transmissive pixel electrode 210. The gate line 206 is a line for supplying a scanning signal to the TFT element 230. The signal line 205 is a line for applying signal voltage to the TFT element 230.

Figure 16:
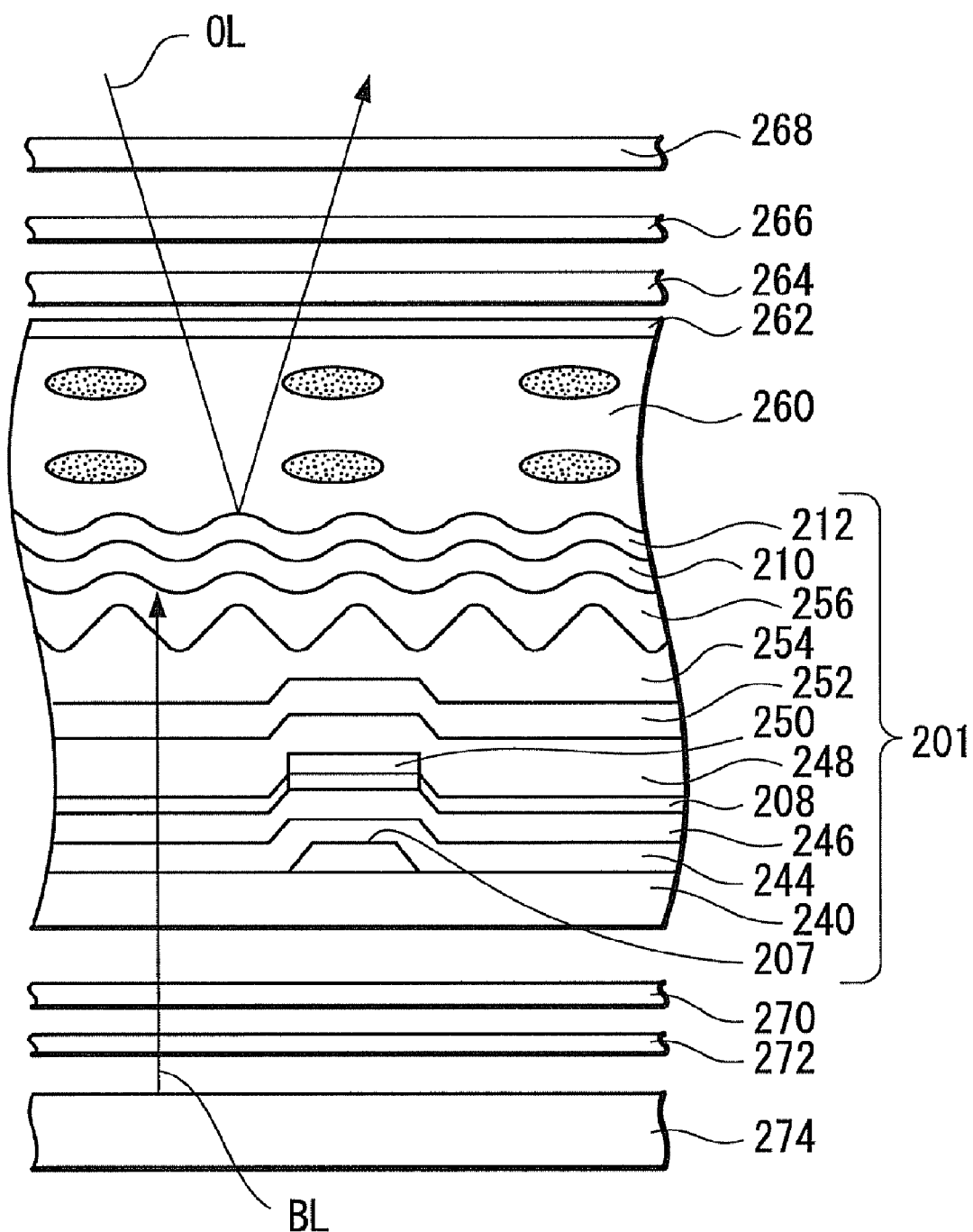
FIG. 16 is a cross-sectional view showing a cross-sectional structure of a periphery of a TFT element 230 in FIG. 15.
Figure 17:
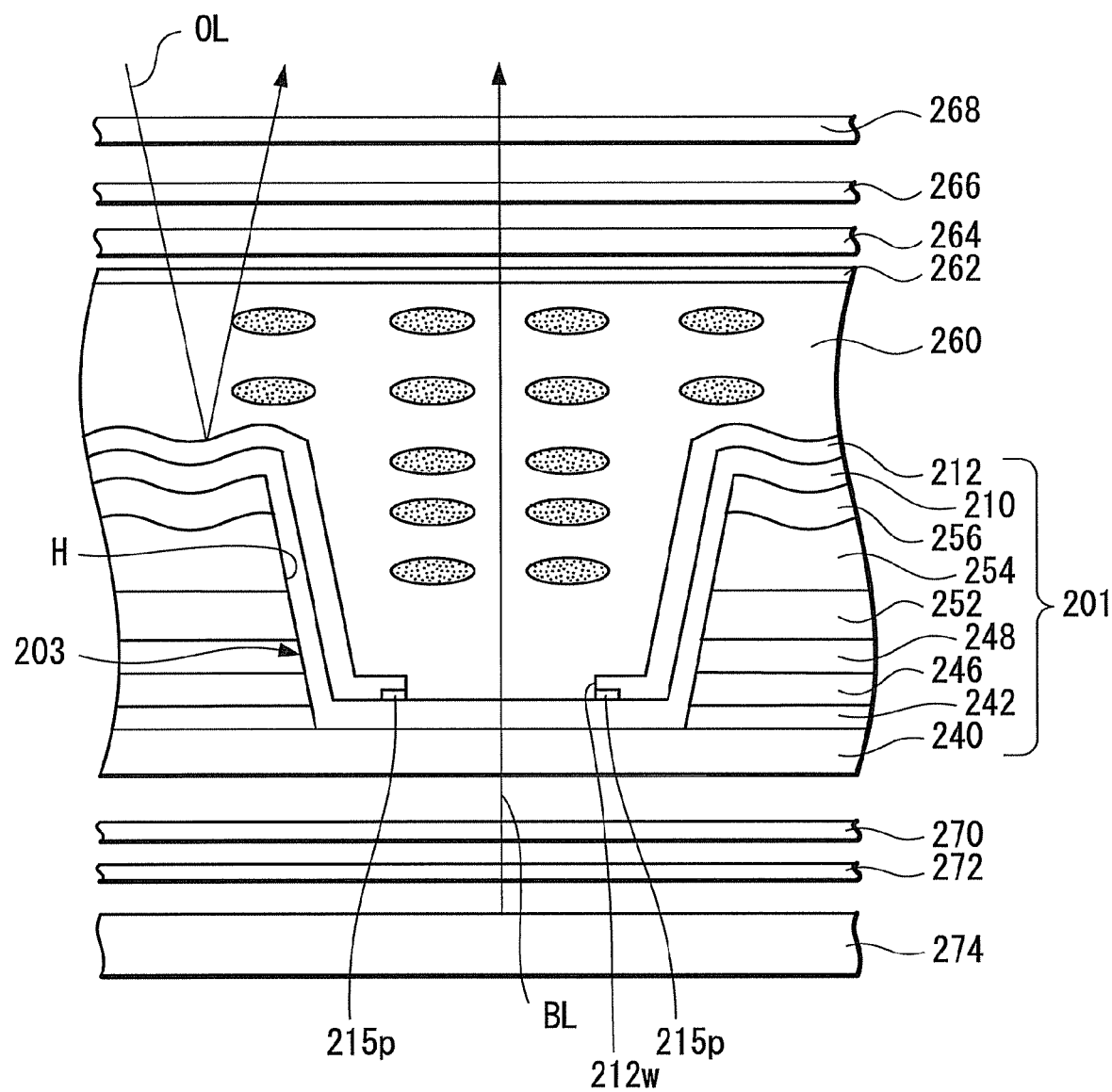
FIG. 17 is a cross-sectional view showing a cross-sectional structure of a periphery of an opening 212$w$ of the driving substrate 201 in FIG. 15.

FIG. 16 is a cross-sectional view showing a cross-sectional structure of a periphery of the TFT element 230 of the driving substrate 201 along a B-B line in FIG. 15. FIG. 17 is a cross-sectional view showing a cross-sectional structure of a periphery of the opening 212w of the driving substrate 201 along a C-C line in FIG. 15. As shown in FIGS. 16 and 17, the liquid crystal display further includes a facing electrode 262, a color filter 264, a phase difference plate 266 and a polarizing plate 268 placed facing an electrode forming surface of the driving substrate 201; and a phase difference plate 270, a polarizing plate 272 and a planar light source 274 placed on a back surface of the driving substrate 201.

The driving substrate 201 has a substrate 240, the gate electrode 207, a barrier film 244, a gate insulating film 246, the polysilicon layer 208, a stopper layer 250, insulating interlayers 248 and 252, a diffusion plate 254, a planarization layer 256, the transmissive pixel electrode 210 and the reflective pixel electrode 212.

The substrate 240 is formed of a light transmissive material such as a glass material, for example. The gate electrode 207 is patterned on the substrate 240 together with the gate line 206. The gate electrode 207 is obtained by depositing a conductive material such as Cr or Mo (molybdenum) on the substrate 240 by sputtering, for example, and patterning the thin film of Cr, Mo or the like by photolithography, for example.

The barrier film 244 is deposited on the substrate 240 to cover the gate electrode 207. The barrier film 244 is obtained by depositing silicon nitride on the substrate 240 by plasma CVD, for example. The gate insulating film 246 is formed on the barrier film 244 by depositing silicon nitride by plasma CVD, for example.

The polysilicon layer 208 is patterned on the gate insulating film 246. The polysilicon layer 208 is obtained by depositing amorphous silicon on the gate insulating film 246 by plasma CVD, for example; then annealing the amorphous silicon to remove hydrogen contained in the amorphous silicon and convert the amorphous silicon into polysilicon; and patterning the polysilicon by photolithography, for example. Impurities such as phosphorus (P) are injected into the polysilicon layer 208 on both sides of the stopper layer 250 at a predetermined concentration and activated to form an LDD (lightly doped drain) region and an $N^+$ region.

The stopper layer 250 is formed of silicon oxide, for example. The stopper layer 250 is obtained by depositing silicon oxide on the gate insulating film 246 by CVD to cover the polysilicon layer 208, for example; and then patterning the silicon oxide by self-alignment using the gate electrode 207 as a mask. Therefore, the stopper layer 250 covers an area of the polysilicon layer 208 above the gate electrode 207. The LDD region is formed by ion implantation of impurities using the stopper layer 250 as a mask. The $N^+$ region is formed by masking the stopper layer 250 and a periphery of the stopper layer 250 with a photoresist and then ion-implanting impurities into the polysilicon layer 208. Subsequently, the impurities are activated by annealing.

The insulating interlayer 248 is formed on the gate insulating film 246 to cover the stopper layer 250 and the polysilicon layer 208. The insulating interlayer 248 is formed by depositing silicon oxide by CVD, for example. The insulating interlayer 252 is formed on the insulating interlayer 248. The insulating interlayer 252 is formed by depositing silicon nitride by CVD, for example.

The diffusion plate 254 is formed on the insulating interlayer 252. The diffusion plate 254 has surface irregularities. The irregularities are provided to form irregularities on the reflective electrode 212 formed above the diffusion plate 254 and diffuse light incident on the reflective electrode 212 to improve luminance of a screen. The diffusion plate 254 is obtained by applying a resist formed of an acrylic resin or the like onto the insulating interlayer 252 by spin coating; fixing the resist to the ground layer by post-baking to remove the solvent; and forming irregularities on a surface of the resist. The resist surface is processed to have irregularities by photolithography or laser processing, for example.

The planarization layer 256 is formed on the diffusion plate 254 and provided to make the surface irregularities in the diffusion plate 254 smooth and make the transmissive pixel electrode 210 and the reflective pixel electrode 212 easily fixed. Therefore, a surface of the planarization layer 256 is more planarized than a surface of the diffusion plate 254.

As shown in FIG. 17, a tapered hole H is formed reaching the substrate 240 through the barrier film 242, the gate insulating film 246, the insulating interlayers 248 and 252, the diffusion plate 254 and the planarization layer 256. As shown in FIG. 17, the transmissive pixel electrode 210 is formed on the planarization layer 256 and is formed to cover an inner periphery of the tapered hole H and a surface of the substrate 240 forming a bottom part of the hole H. The transmissive pixel electrode 210 is formed of a conductive transmissive film made of ITO, for example. The transmissive pixel electrode 210 is patterned into a rectangular shape as shown in FIG. 17.

The reflective pixel electrode 212 is formed on the whole surface of the transmissive pixel electrode 210. The reflective pixel electrode 212 has the opening 212w formed as shown in FIG. 17. The reflective pixel electrode 212 is formed of a conductive reflective film (metal film) made of Al, for example. Therefore, the reflective pixel electrode 212 is electrically connected to the transmissive pixel electrode 210. The reflective pixel electrode 212 is formed by patterning a conductive reflective film 211 deposited on the transmissive pixel electrode 210 by ablation processing with laser light as described later. Further, in this patterning, the stopper layer 215 made of a resin or the like is previously formed on the tapered hole H in the transmissive pixel electrode 210.

The facing electrode 262, the color filter 264, the phase difference plate 266 and the polarizing plate 268 are integrally provided facing the driving substrate 201 where pixel electrodes are formed. The phase difference plate 270, the polarizing plate 272 and the planar light source 274 are integrally provided facing the driving substrate 201 opposite to the side where pixel electrodes are formed. The facing electrode 262 is formed of a conductive transmissive film made of ITO or the like and forms an electric field between the transmissive pixel electrode 210 and the reflective pixel electrode 212.

The polarizing plates 268 and 272 convert incident light into linearly polarized light. The phase difference plates 266 and 270 perform optical compensation converting the linearly polarized light incident through the polarizing plate 268 or 272 into circularly polarized light in order to improve contrast and reduce and prevent a color change in the liquid crystal display. The color filter 264 has fine colored layers of three primary colors of red (R), green (G) and blue and a shielding layer called a black matrix with a predetermined pattern. The planar light source 274 includes a light source such as a cold cathode fluorescent tube and outputs planar light BL to the substrate 240.

As a liquid crystal 260 enclosed between the facing electrode and the transmissive pixel electrode 210 and the reflective pixel electrode 212, a twisted nematic (TN) liquid crystal is used, for example.

In the liquid crystal display having the above configuration, outer light OL incident on the polarizing plate 268 passes through the polarizing plate 268, the phase difference plate 266, the color filter 264 and the facing electrode 262, is incident on the reflective pixel electrode 212, is reflected by the reflective pixel electrode 212 and is again output to outside from the polarizing plate 268. Since the reflective pixel electrode 212 has surface irregularities due to the irregularities in the diffusion plate 254, the outer light OL incident on the reflective pixel electrode 212 is scattered and luminance of a screen is improved.

As shown in FIG. 16, on the other hand, the light BL output from the planar light source 274 is screened by the reflective pixel electrode 212 and is not output to outside from the polarizing plate 268 in a region in which the reflective pixel electrode 212 is present. However, as shown in FIG. 17, part of the light BL incident on the transmissive pixel electrode 210 passes through the opening 212w of the reflective pixel electrode 212 and is output to outside through the facing electrode 262, the color filter 264, the phase difference plate 266 and the polarizing plate 268. As a result, a high-luminance and power-saving liquid crystal display may be obtained where the planar light source 274 is used in a dark place and outer light is reflected by the reflective pixel electrode 212 in a light place.

Next, a method for forming the reflective pixel electrode 212 will be described. The reflective pixel electrode 212 is formed (patterned) using the laser processing apparatus 20 shown in FIG. 4 including the debris collection device 22.

The laser control unit 1 as a laser light source outputs the laser light 3 (later-described laser beam LB). A surface of an object (the object film 26) is processed by the laser light 3 output from the laser control unit 1. An excimer laser or YAG laser is used for the laser control unit 1, for example. As described above, there are a plurality of types of excimer lasers with different laser media. An excimer laser greatly differs from a YAG laser (1.06 μm) and a $CO_2$ laser (10.6 μm) performing processing using thermal energy in that the excimer laser has an oscillation wavelength in a ultraviolet region. The excimer laser essentially only pulse oscillates and has a pulse width of about 20 ns and a rectangular laser beam shape, for example. Since the excimer laser performs processing called ablation which photochemically dissociates bonds directly and is difficult to be thermally affected, the resulting edge of the processed surface is extremely sharp. On the other hand, since an area processed by the YAG laser or $CO_2$ laser is evaporated after melting, a periphery of the processed area is round and the resulting edge is not sharp. Further, the excimer laser has an initial beam cross-section with a dimension of about 10×10 mm, and may collectively process a relatively large area at a time when the laser beam has an area increased by the beam shaper 14 in terms of length and width. Therefore, the excimer laser is suitable for processing a region having a large area simultaneously.

There will be described a method for forming electrodes with reference to FIGS. 18 to 21. According to this embodiment, the transmissive pixel electrode 210 and the reflective pixel electrode 212 are conducted even when a stopper layer formed of a non-conductive material such as a resin material is used, allowing damage to the transmissive pixel electrode 210 by the laser beam LB to be prevented. In FIGS. 18 to 21, the same components as in FIGS. 16 and 17 are indicated by the same symbols.

Figure 18:
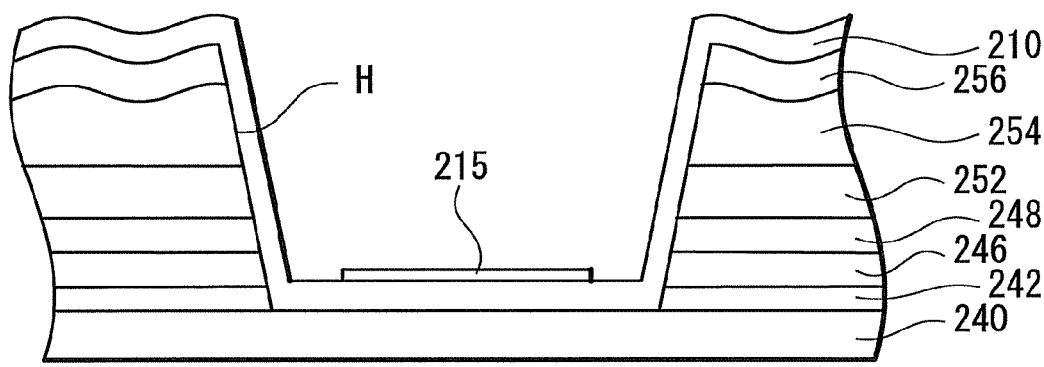
FIG. 18 is a cross-sectional view for describing a procedure in a method for producing a display panel according to an embodiment of the present invention.

First, as shown in FIG. 18, the hole H is formed in the barrier film 242, the gate insulating film 246, the insulating interlayers 248 and 252, the diffusion plate 254 and the planarization layer 256 stacked on the substrate 240 of the driving substrate 201; a conductive transmissive film is then formed on the planarization layer 256; and the conductive transmissive film is patterned to form the transmissive pixel electrode 210. The transmissive pixel electrode 210 may be patterned using the above-described laser processing apparatus 20. Annealed ITO is used as the conductive transmissive film forming the transmissive pixel electrode 210, for example. The conductive transmissive film is formed by sputtering, for example.

FIG. 18 shows a state where the hole H is formed; the conductive transmissive film is then formed on the planarization layer 256; the conductive transmissive film is patterned to form the transmissive pixel electrode 210; and the stopper layer 215 is then formed on a surface of the transmissive pixel electrode 210 in the hole H. The stopper layer 215 is formed of a material through which visible light is transmitted. For example, a transparent resin material is used. If used, the resin material preferably has an absorptivity as high as possible near a wavelength of the laser beam LB from the laser processing apparatus 20. For example, the resin material has a high absorptivity near a wavelength of a KrF excimer laser of 248 nm. The stopper layer 215 may be formed by laser processing or a photolithography process using the laser processing apparatus 20, for example.

Figure 19:
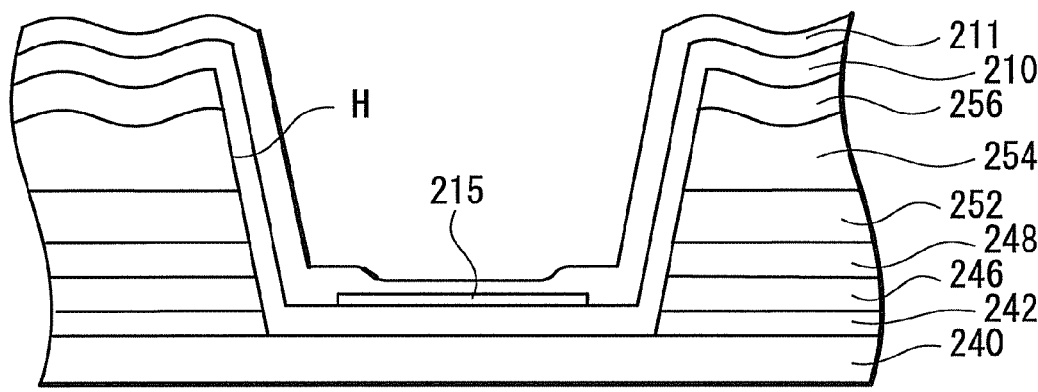
FIG. 19 is a cross-sectional view for describing a procedure subsequent to the procedure shown in FIG. 18 in a method for producing a display panel according to an embodiment of the present invention.

After forming the stopper layer 215 using a resin material, the conductive reflective film 211 is formed to cover the stopper layer 215 and the transmissive pixel electrode 210 patterned in rectangular shape as shown in FIG. 19. As the conductive reflective film 211, a conductive reflective film (metal film) made of Al is used, for example. The conductive reflective film 11 is formed by sputtering, for example. Accordingly, the conductive reflective film 211 is electrically connected to the transmissive pixel electrode 210.

Figure 20:
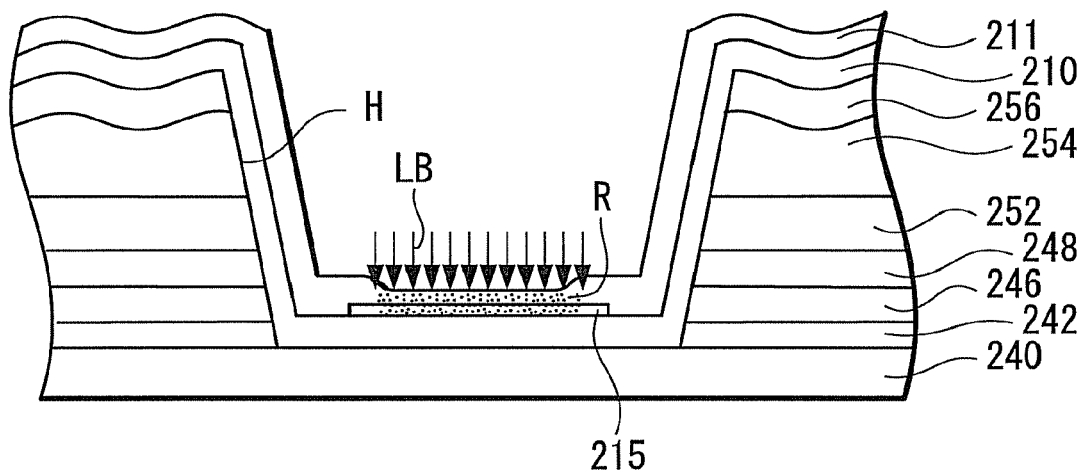
FIG. 20 is a cross-sectional view for describing a procedure subsequent to the procedure shown in FIG. 19 in a method for producing a display panel according to an embodiment of the present invention.

Next, the driving substrate 201 having the conductive reflective film 211 formed is placed on the above-described laser processing apparatus 20, and a surface of the conductive reflective film 211 is irradiated with the laser beam LB having a predetermined pattern as shown in FIG. 20. The conductive reflective film 211 is intermittently irradiated with the laser beam LB as pulses. Power of the laser beam LB is set so that an irradiated region R of the conductive reflective film 211 is not entirely removed by irradiation at a time and only part of the conductive reflective film 211 is removed by ablation. Here, debris generated from the processed surface by irradiation with the laser beam LB is entrained in a vortex gas flow together with gas near the laser light irradiation area and is efficiently collected and removed by a debris collection method using the debris collection device as shown in FIG. 11 or 13.

When the irradiated region R of the conductive reflective film 211 is repeatedly irradiated with the laser beam LB, the irradiated region R is gradually removed. When the irradiated region R of the conductive reflective film 211 is completely removed, the stopper layer 215 is exposed from an opening formed in the conductive reflective film 211. Further irradiation with the laser beam LB is performed, and irradiation with the laser beam LB is stopped when the stopper layer 215 is also removed by ablation. Irradiation with the laser beam LB is stopped before the lower transmissive pixel electrode 210 is damaged by the laser beam LB.

Figure 21:
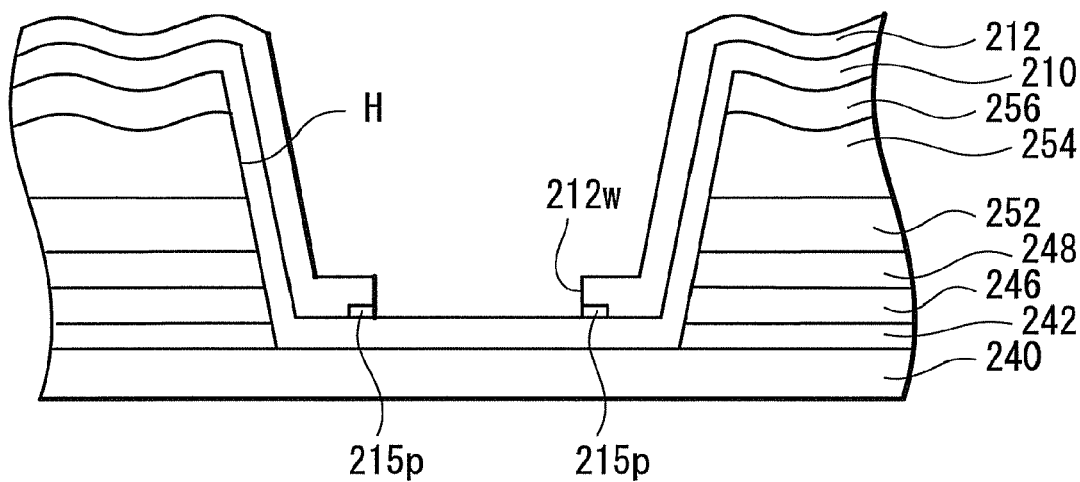
FIG. 21 is a cross-sectional view showing a display panel with a reflective pixel electrode patterned.

As described above, the conductive reflective film 211 is patterned by irradiating the conductive reflective film 211 with the laser beam LB having a predetermined pattern, and the reflective pixel electrode 212 having the opening 212w is thus formed as shown in FIG. 21. Here, a part 215p of the stopper layer 215 may remain between the reflective pixel electrode 212 and the transmissive pixel electrode 210. However, the stopper layer 215 is a transmissive film and therefore may not prevent transmission of visible light through the transmissive pixel electrode 210 in the opening.

In the above process, the rectangular reflective pixel electrode 212 shown in FIG. 15 having the opening 212w is patterned. In the present embodiment, the stopper layer 215 is formed between the conductive reflective film for the reflective pixel electrode 212 and the transmissive pixel electrode 210. Accordingly, the transmissive pixel electrode 210 is prevented from being removed or damaged, for example, stripped from the substrate 240 when the reflective pixel electrode 212 is patterned with the laser beam LB. As a result, the reflective pixel electrode 212 may be formed with the laser beam LB.

As described above, according to the method for producing a display panel of the present embodiment, debris generated during patterning a metal film (the reflective pixel electrode 212) on an object may be efficiently collected using the debris collection device 22. Accordingly, debris generated during laser light irradiation is efficiently removed, and therefore debris attached to the object may be reduced. This makes it possible to improve a processed edge shape or eliminate a residue. Therefore, it is possible to produce a liquid crystal display formed of a multilayer film having a fine and accurate surface structure.

Further, according to the method for producing a display panel of the present embodiment, in the case where the stopper layer is formed of a non-conductive material, that is, a resin material, the transmissive pixel electrode 210 is electrically connected to the reflective pixel electrode 212, and the reflective pixel electrode 212 may be processed without damaging the transmissive pixel electrode 210 by the laser beam LB. The stopper layer 215 may be formed of any material selected according to a wavelength of a laser used for the laser processing apparatus 20.

In the above embodiment, a liquid crystal display is produced by a method including the step of processing a metal film (the reflective pixel electrode 212) deposited on a resin (the stopper layer 215); however, a liquid crystal display may also be produced by a method including the step of processing a resin film deposited on a resin film using a laser processing apparatus (debris collection mechanism) according to an embodiment of the present invention. The liquid crystal display is one example of a display panel (flat display panel). A production method according to an embodiment of the present invention is not limited to this example and may be applied to various display panels.

It should be understood by those skilled in the art that various modifications, combinations, sub-combinations and alterations may occur depending on design requirements and other factors insofar as they are within the scope of the appended claims or the equivalents thereof.

What is claimed is:

1. A laser processing apparatus for patterning a resin or a metal film on a substrate using laser light on the resin film or the metal film comprising:
    a laser light source; and
    a debris collector including (a) an enclosure, (b) a transmission window at one side of the enclosure through which laser light emitted by the laser light source can be transmitted, (c) a transmission hole at an opposite side of the enclosure through which the laser light can be transmitted after passing through the enclosure, (d) a vortex generation mechanism in the form of a plate having a plurality of radial grooves and located at the side of the enclosure where the transmission hole is located and that generates a vortex gas flow at a side the plate facing the enclosure and a suction force at an oppositely facing side of the plate to entrain debris created by irradiation of the laser light into the vortex gas flow, (e) an exhaust port in the enclosure through which gas can be exhausted and (f) a screening device positioned between the vortex generation mechanism and the enclosure and having an opening through which the laser light passes in a first direction and through which gas from the gas flows in an opposite second direction into the enclosure,
    wherein,
        the debris entrained in the vortex gas flow is screened and is removed from the vortex gas flow prior to entering the enclosure by the screening device.

2. A laser processing apparatus according to claim 1, wherein:
    the vortex generation mechanism has a vortex forming part with an opening through which the laser light can pass and through which debris laden gas can flow, the vortex forming plate having a radial vortex forming groove corresponding to a rotation direction of the vortex gas flow and communicating with the transmission hole, the vortex forming groove formed on a surface of the vortex forming part facing away from the enclosure; and
    gas is introduced into the vortex forming groove of the groove forming part so that the gas flowing in the vortex forming groove forms the vortex gas flow the vortex gas flow is exhausted to outside from the exhaust hole through the transmission hole of the vortex gas flow exhaust part.

3. A laser processing apparatus according to claim 2, wherein the screening device is a screening plate with a hole forming the opening of the screening device.

4. A laser processing apparatus according to claim 2, wherein the screening device has an irregular bellows structure with interior corners of folds of the bellows structure forming the opening of the screening device.

5. A laser processing apparatus according to claim 3 or 4, wherein the opening of the screening device is as large as or slightly larger than a diameter of a beam of the laser light.

6. A laser processing apparatus according to claim 2, wherein the vortex forming groove is formed such that an acute angle is formed on a downstream side of the vortex gas flow among angles formed between the vortex forming groove and a tangent to a concentric circle of the transmission hole.

7. A laser processing apparatus according to claim 2, wherein:
    the debris collector further includes a circular groove in communication with the vortex forming groove, on an outer periphery of the surface of the vortex forming plate facing away from the enclosure; and
    gas introduced from a gas supply hole formed in the circular groove is supplied to the vortex forming groove thereby causing a gas flow to be generated in the circular groove in a direction identical to the rotation direction of the vortex gas flow.

8. A laser processing apparatus according to claim 7, wherein:
    the debris collection means further includes a gas introduction part introducing gas into the gas supply hole formed in the circular groove; and
    the gas introduction part corresponds in position to the vortex forming groove and is placed inclined to an upstream side in the rotation direction of the generated vortex gas flow relative to a straight line connecting a center of the transmission hole to the gas supply hole of the circular groove.

9. A laser processing apparatus according to claim 2, wherein the vortex forming groove formed in the groove forming plate has a groove width on the circular groove larger than a groove width on the transmission hole at a predetermined ratio.

10. A laser processing apparatus according to claim 9, wherein the following relation is satisfied:

W1:W2=1:1.5 to 2.5, where the groove width on the circular groove is defined as W1 and the groove width on the transmission hole is defined as W2 in the vortex forming groove formed in the groove forming plate.

11. A laser processing apparatus according to claim 2, wherein the debris collector further includes a space between the transmission hole of the vortex gas flow exhaust part and the vortex forming groove of the vortex forming plate in which a circular gas flow is formed.

12. A laser processing apparatus according to claim 11, wherein a curved shape or tapered shape is formed on a wall surface near the opening of the transmission hole connected to the space forming the circular gas flow.

13. A laser processing method for patterning a resin or a metal film formed on a substrate using laser light on the resin film or the metal film, the laser processing method comprising:

providing a laser light source;

bringing closer to the substrate a debris collection device having (a) an enclosure, (b) a transmission window at one side of the enclosure through which laser light emitted by the laser light source can be transmitted, (c) a transmission hole at an opposite side of the enclosure through which the laser light can be transmitted after passing through the enclosure, (d) a vortex generation mechanism in the form of a plate having a plurality of radial grooves and located at the side of the enclosure where the transmission hole is located and that generates a vortex gas flow at a side of the plate facing the enclosure and a suction force at an oppositely facing side of the plate to suck debris created by irradiation of the laser light on a surface to entrain the debris in the vortex gas flow, (e) an exhaust port in the enclosure through which gas can be exhausted and (f) a screening device positioned between the vortex generation mechanism and the enclosure and having an opening through which the laser light passes in a first direction and through which gas from the gas flows in an opposite second direction into the enclosure;

irradiating the resin or the metal film with the laser light;

entraining debris generated by the laser light irradiation on the resin film or the metal film in the vortex gas flow generated by the vortex generation mechanism; and screening the vortex gas flow with the screening device to remove the debris therefrom.

14. A laser processing apparatus for patterning a resin film or a metal film formed on a substrate using laser light, the laser processing apparatus comprising:

a laser light source emitting laser light; and a debris collection device including (a) an enclosure, (b) a transmission window at one side of the enclosure through which laser light emitted by the laser light source can be transmitted, (c) a transmission hole at an opposite side of the enclosure through which the laser light can be transmitted after passing through the enclosure, (d) a vortex generation mechanism in the form of a plate having a plurality of radial grooves and located at the side of the enclosure where the transmission hole is located and that generates a vortex gas flow at a side of the plate facing the enclosure and a suction force at an oppositely facing side of the plate to suck debris created by irradiation of the laser light on a surface and entrain the debris in the vortex gas flow, (e) an exhaust port in the enclosure through which gas can be exhausted and (f) a screening device positioned between the vortex generation mechanism and the enclosure and having an opening through which the laser light passes in a first direction and through which gas from the gas flows in an opposite second direction into the enclosure, wherein, the vortex generation mechanism of the debris collection device is placed close to the resin film or the metal film on the substrate, and the debris entrained in the vortex gas flow is screened and is removed from the vortex gas flow prior to entering the enclosure by the screening device.

* * * * *